United States Patent
Satou

(10) Patent No.: US 8,891,260 B2
(45) Date of Patent: Nov. 18, 2014

(54) POWER CONVERTER WITH VOLTAGE FLUCTUATION SUPPRESSION IN SWITCHING ELEMENTS

(75) Inventor: Toshiaki Satou, Shiga (JP)

(73) Assignee: Daikin Industries, Ltd., Osaka (JP)

( * ) Notice: Subject to any disclaimer, the term of this patent is extended or adjusted under 35 U.S.C. 154(b) by 55 days.

(21) Appl. No.: 13/517,053

(22) PCT Filed: Jan. 11, 2011

(86) PCT No.: PCT/JP2011/050249
§ 371 (c)(1),
(2), (4) Date: Jun. 19, 2012

(87) PCT Pub. No.: WO2011/089945
PCT Pub. Date: Jul. 28, 2011

(65) Prior Publication Data
US 2012/0327694 A1   Dec. 27, 2012

(30) Foreign Application Priority Data

Jan. 19, 2010  (JP) .................................. 2010-008740

(51) Int. Cl.
| | |
|---|---|
| H02M 5/458 | (2006.01) |
| H03K 17/567 | (2006.01) |
| H02M 7/217 | (2006.01) |
| H02M 1/00 | (2006.01) |

(52) U.S. Cl.
CPC ........ *H02M 7/217* (2013.01); *H03K 2217/0081* (2013.01); *H03K 17/567* (2013.01); *H02M 5/4585* (2013.01); *H02M 2001/0006* (2013.01)
USPC .......................................................... 363/37

(58) Field of Classification Search
CPC ..................... H02M 5/4585; H02M 2001/322; H03K 2117/0063; H03K 2117/0081
USPC ............... 318/811; 363/34, 37, 50, 55, 56.01, 363/131; 323/283
See application file for complete search history.

(56) References Cited

U.S. PATENT DOCUMENTS

| | | | |
|---|---|---|---|
| 6,522,098 B1 | 2/2003 | Majumdar et al. | |
| 2005/0194925 A1 | 9/2005 | Ito et al. | |
| 2009/0086515 A1* | 4/2009 | Sakakibara | 363/37 |
| 2010/0295523 A1 | 11/2010 | Grbovic | |
| 2011/0199799 A1* | 8/2011 | Hui et al. | 363/127 |

FOREIGN PATENT DOCUMENTS

| | | |
|---|---|---|
| CN | 1658486 A | 8/2005 |
| CN | 101432958 A | 5/2009 |
| JP | 3-32356 A | 2/1991 |
| JP | 7-250485 A | 9/1995 |

(Continued)

*Primary Examiner* — Adolf Berhane
*Assistant Examiner* — Jye-June Lee
(74) *Attorney, Agent, or Firm* — Birch, Stewart, Kolasch & Birch, LLP

(57) ABSTRACT

A switching element connects/disconnects an input end to/from at least either of power supply lines. A switching element is provided between the power supply lines. One end on the low potential side of a power supply unit is connected to the switching element on the side of either of the power supply lines. One end of a capacitor is connected between the switching element and the input end. The other end of the capacitor is connected to one end on the high potential side of the power supply unit. The capacitor and the power supply unit respectively serve as operation power supplies for outputting switch signals to the switching elements. A voltage adjustment unit maintains voltage across both ends of the capacitor.

17 Claims, 18 Drawing Sheets

(56) References Cited

FOREIGN PATENT DOCUMENTS

| JP | 2002-84762 | A | 3/2002 |
|----|------------|---|--------|
| JP | 2004-153889 | A | 5/2004 |
| JP | 2006-246617 | A | 9/2006 |
| JP | 2007-288892 | A | 11/2007 |
| JP | 2007-295686 | A | 11/2007 |
| JP | 4158715 | B2 * | 10/2008 |
| JP | 4158715 | B2 | 10/2008 |
| JP | 2010-273537 | A | 12/2010 |

* cited by examiner

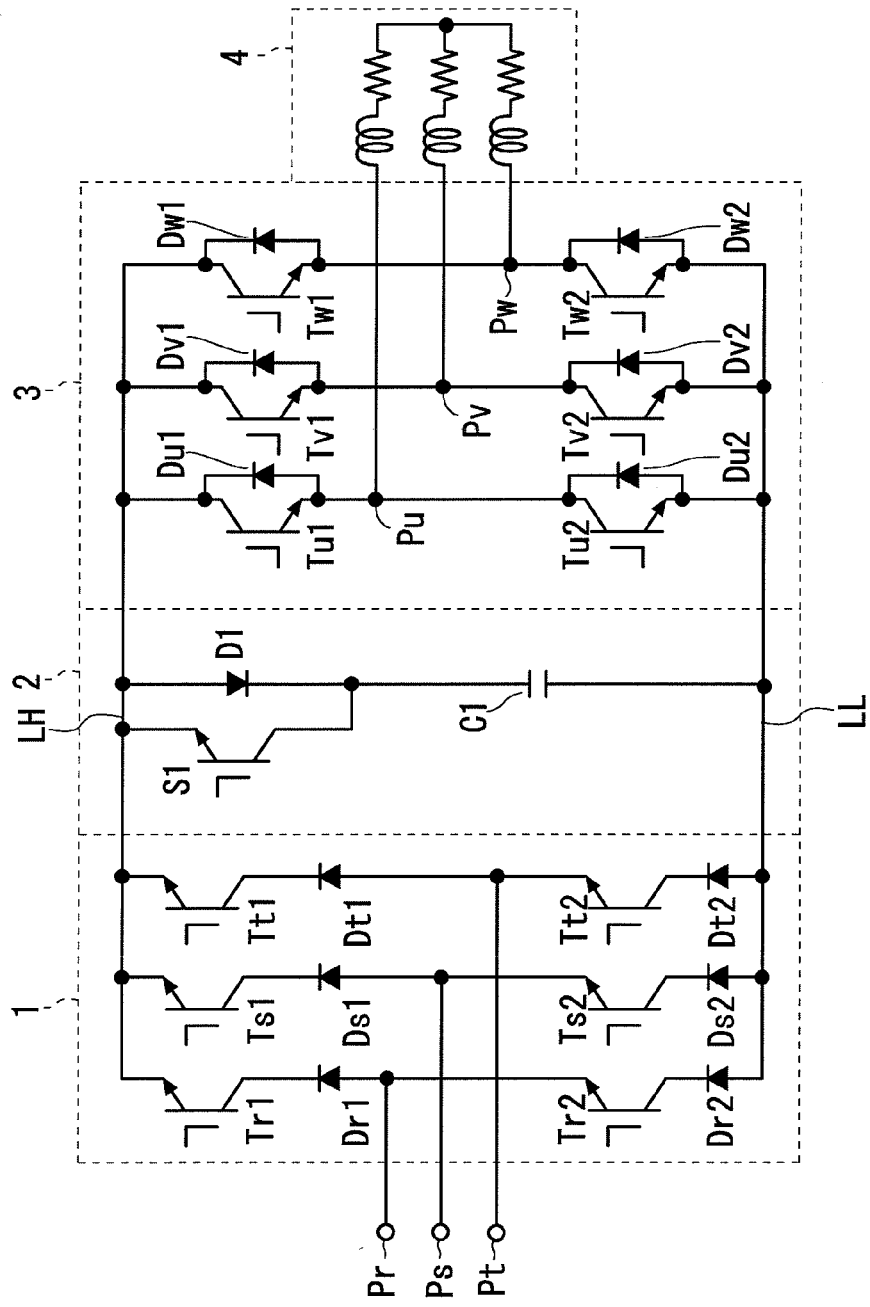
F I G. 1

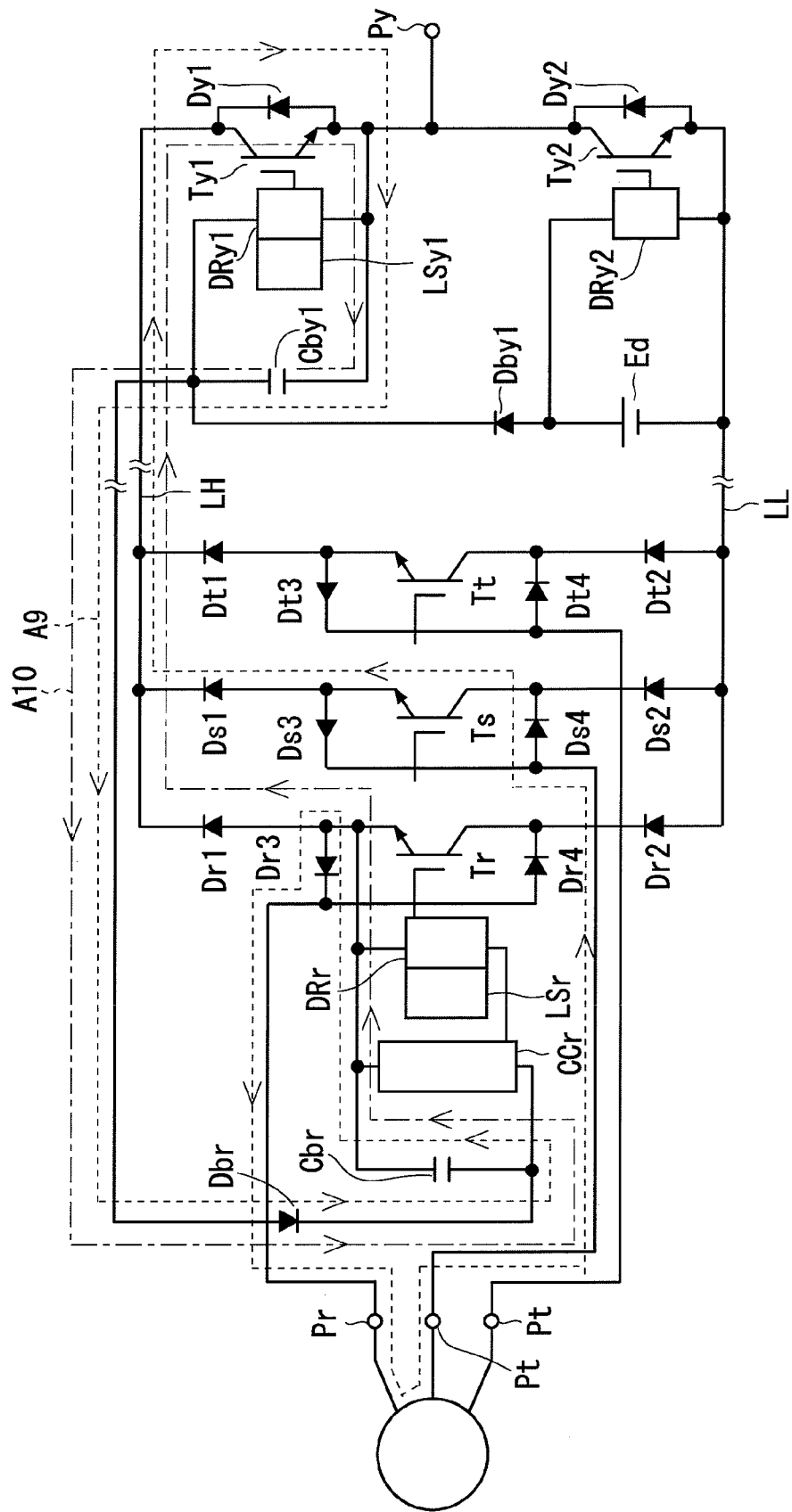
F I G . 1 2

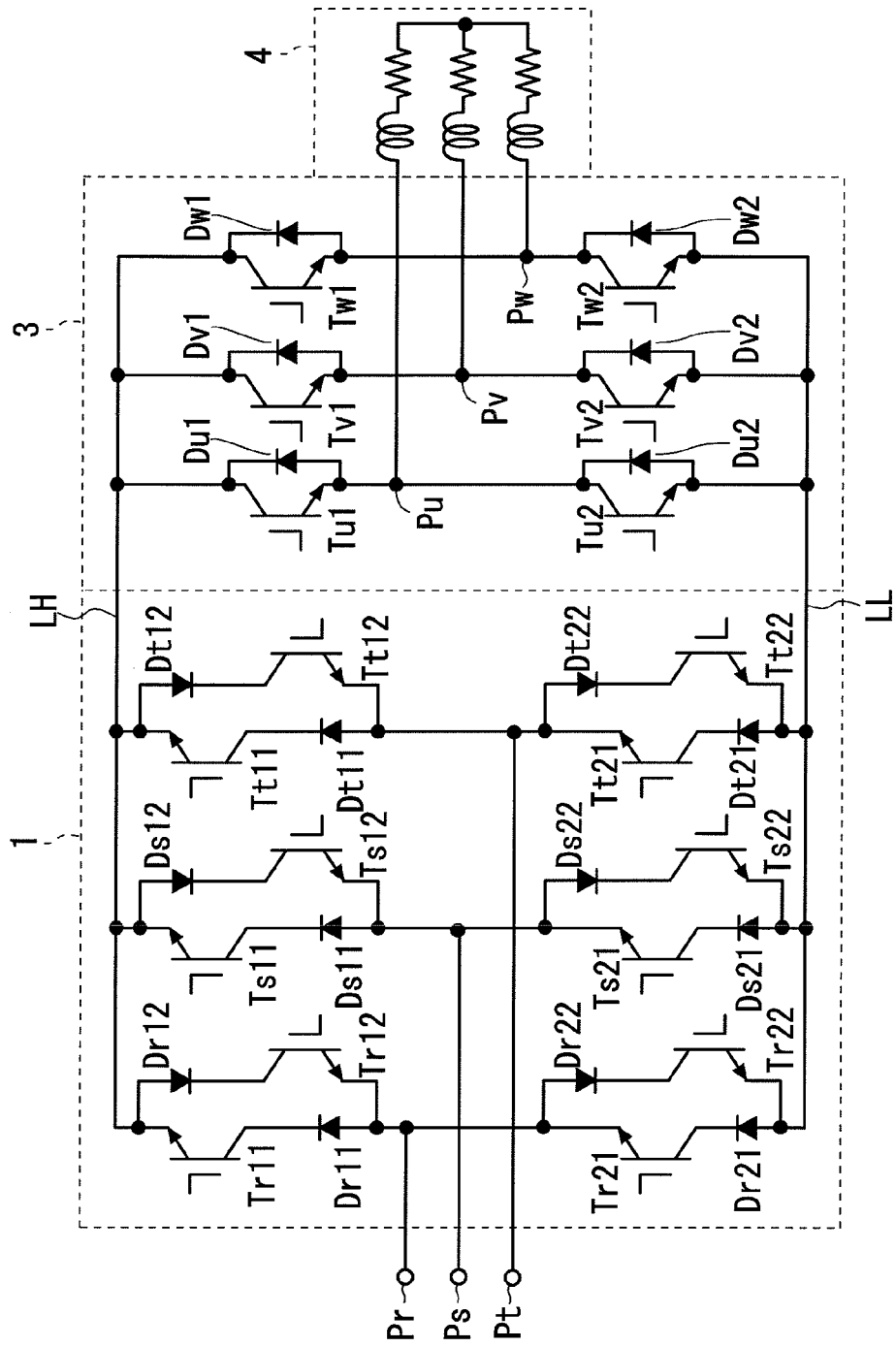
F I G . 1 4

F I G . 1 7
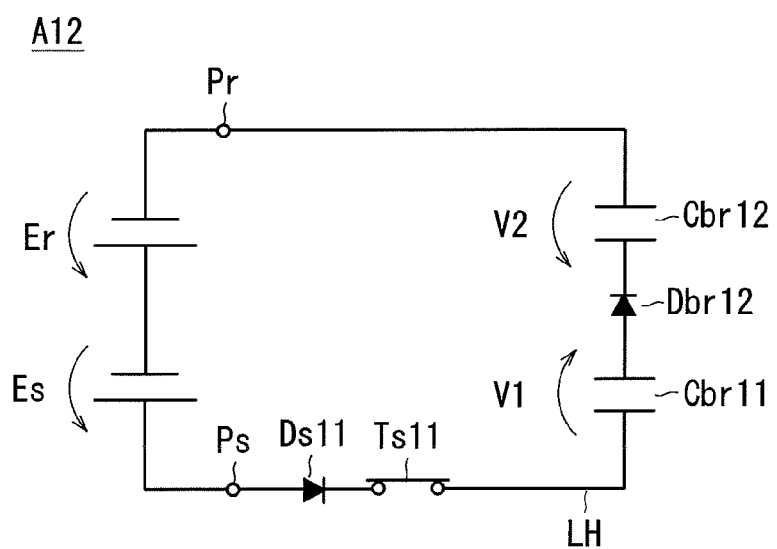

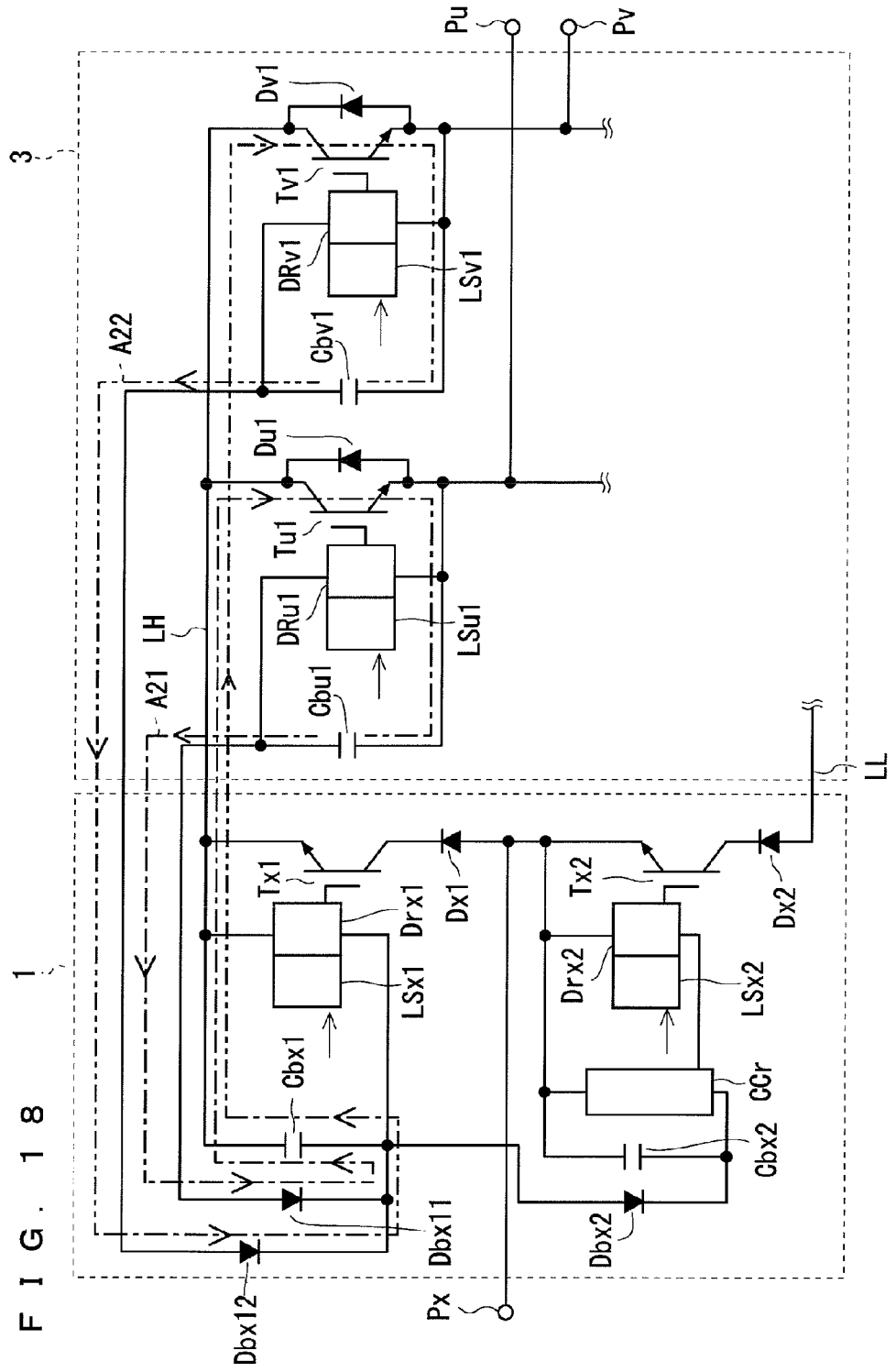

POWER CONVERTER WITH VOLTAGE FLUCTUATION SUPPRESSION IN SWITCHING ELEMENTS

TECHNICAL FIELD

The present invention relates to power converters, and in particular, to an operation power supply for outputting the switch signal to a switching element.

BACKGROUND ART

Patent document 1 (Japanese Patent Application Laid-Open No. 7-250485) describes an inverter. The inverter includes an upper side switching element and a lower side switching element connected in series to each other between two direct current (DC) power supply lines. A first internal control circuit for providing a switch signal is connected to the upper side switching element, and a second internal control circuit for providing a switch signal is connected to the lower side switching element.

The DC power supply is supplied to the second internal control circuit as the operation power supply. A voltage between both ends of a capacitor is supplied to the first internal control circuit as the operation power supply. A diode is connected between one end on a high potential side of the capacitor and one end on a high potential side of the DC power supply. The diode is arranged with an anode directed towards the DC power supply.

According to such configuration, the capacitor is charged with the DC power supply as a power supply by conduction of the lower side switching element.

Techniques related to the present invention are also disclosed in Japanese Patent No. 4158715 and Japanese Patent Application Laid-Open No. 2007-295686.

SUMMARY OF THE INVENTION

Problems to be Solved by the Invention

However, the description on the operation power supply is not made for the switching element of the converter in Japanese Patent Application Laid-Open No. 7-250485. Furthermore, as the AC power source is input to the converter, a specific problem of the voltage fluctuation of the operation power supply originating therefrom arises.

It is thus an object of the present invention to provide a power converter for suppressing the voltage fluctuations of the operation power supply of the switching element of the converter.

Means for Solving the Problems

A first aspect of a power converter according to the present invention includes a first power supply line (LH); a second power supply line (LL) applied with a potential lower than that of the first power supply line; a plurality of input ends (Px) connected with an AC power source; a first switching element (Tr2, Tr, Tr12) for connecting/disconnecting the plurality of input ends and at least one of either the first or second power supply line; a second switching element (Tr1, Tu1, Tr11, Ty1) arranged between the first and second power supply lines; a power supply unit (Cbr1, Cbu1, Cbr11, Cby1) having both ends for supporting a DC voltage, being connected to the second switching element on the first or second power supply line side, and serving as an operation power supply for outputting a switch signal to the second switching element; a capacitor (Cbr2, Cbr, Cbr12) including one end connected to a point between the first switching element and the one of the plurality of input ends and other end connected to one end on a high potential side of the power supply unit; and serving as an operation power supply for outputting a switch signal to the first switching element; and a voltage adjustment unit (CCr) for adjusting a voltage across both ends of the capacitor.

A second aspect of the power converter according to the present invention relates to the power converter according to the first aspect, wherein the first switching element (Tr2) is connected between the one of the plurality of input ends (Pr) and the second power supply line (LL); and the second switching element (Tr1) is connected between the one of the plurality of input ends and the first power supply line (LH), and connected to one end on a low potential side of the power supply unit (Cbr1) on the first power supply line side.

A third aspect of the power converter according to the present invention relates to the power converter according to the second aspect and further includes a third switching element (Tr22) connected in series with the first switching element (Tr21) on the one of the plurality of input ends (Pr) side, a first diode (Dr21) connected in parallel with the third switching element with an anode directed towards the second power supply line, and a second diode (Dr22) connected in parallel with the first switching element with a cathode directed towards the second power supply line; wherein the one end of the capacitor (Cbr2) is connected between the first and third switching elements, and said capacitor serves as an operation power supply for outputting a switch signal to the first and third switching elements.

A fourth aspect of the power converter according to the present invention relates to the power converter according to the second or third aspect and further includes a third diode (Dbr2) arranged with a cathode directed towards the capacitor between one end on the high potential side of the power supply unit (Cbr1) and the other end of the capacitor (Cbr2).

A fifth aspect of the power converter according to the present invention relates to the power converter according to the first aspect and further includes an output end (Py), a third switching element (Tr1), and a diode (Dbr2); wherein the first switching element (Tr2) is connected between the one of the plurality of input ends (Pr) and the second power supply line (LL), the third switching element is connected between the one of the plurality of input ends (Pr) and the first power supply line (LH), the second switching element (Ty1) is connected between the first power supply line and the output end, and connected to one end on a low potential side of the power supply unit (Cby1) on the second power supply line, and the diode is arranged with a cathode directed towards the capacitor between one end on the high potential side of the power supply unit and the other end of the capacitor.

A sixth aspect of the power converter according to the present invention relates to the power converter according to the first aspect and further includes an output end (Py), a first diode (Dr1) arranged with a cathode directed towards the first power supply line between the first power supply line (LH) and the first switching element (Tr), a second diode (Dr2) arranged with an anode directed towards the second power supply line between the second power supply line (LL) and the first switching element, a third diode (Dr3) having a cathode connected to the one of the plurality of input ends (Pr) and an anode connected to an anode of the first diode, a fourth diode (Dr4) having an anode connected to the one of the plurality of input ends and a cathode connected to a cathode of the second diode, and a fifth diode (Dbr) arranged with a cathode directed towards the capacitor between one end on the high potential side of the power supply unit (Cby1) and the other end of the capacitor (Cbr); wherein the second switching element (Ty1) is connected between the first power supply line (LH) and the output end, and connected to one end on a low potential side of the power supply unit (Cby1) on the output end side.

A seventh aspect of the power converter according to the present invention relates to the power converter according to the first aspect and further includes first and second diodes, wherein the second switching element (Tr11) is connected in series with the first diode (Dr11) between the one of the plurality of input ends (Pr) and the first power supply line (LH), the first diode being arranged with a cathode directed towards the first power supply line side, the first switching element (Tr12) is connected in series with the second diode (Dr12) between the one of the plurality of input ends (Pr) and the first power supply line (LH), the second diode being arranged with a cathode directed towards the one of the plurality of input ends, a serial body of the second switching element and the first diode and a serial body of the first switching element and the second diode are connected in parallel to each other, and one end on the low potential side of the power supply unit (Cbr11) is connected to the second switching element on the first power supply line (LH) side.

An eighth aspect of the power converter according to the present invention relates to the power converter according to the seventh aspect and further includes a third diode (Dbr12) arranged with a cathode directed towards the capacitor between one end on the high potential side of the power supply unit (Cbr11) and other end of the capacitor (Cbr12).

A ninth aspect of the power converter according to the present invention relates to the power converter according to any one of the first, fifth, and sixth aspect and further includes a plurality of output ends (Pu, Pv, Pw) and sixth and seventh diodes; wherein the second switching element (Tu1, Tv1, Tw1) and the power supply unit (Cbu1, Cbv1, Cbw1) are in plurals, each of the plurality of second switching elements is arranged between each of the plurality of output ends and the first power supply line (LH), the sixth diode (Dbr2) is arranged between other end of one of the plurality of power supply units (Cbu1) and other end of the capacitor (Cbr2), and the seventh diode is arranged with a cathode directed towards the capacitor between other end of another one of the plurality of power supply units (Cbv1) and other end of the capacitor.

A tenth aspect of the power converter according to the present invention relates to the power converter according to the second or third aspect and further includes third and fourth diodes; wherein the second switching element (Tr1, Ts1, Tw1) and the power supply unit (Cbr1, Cbs1, Cbt1) are in plurals, each of the plurality of second switching elements is arranged between each of the plurality of input ends (Pr, Ps, Pt) and the first power supply line (LH), the third diode (Dbr2) is arranged between other end of one of the plurality of power supply units (Cbu1) and other end of the capacitor (Cbr2), and the fourth diode is arranged with a cathode directed towards the capacitor between other end of another one of the plurality of power supply units (Cbv1) and other end of the capacitor.

Effect of the Invention

According to the first aspect of the power converter of the present invention, the potential applied on one input end fluctuates with respect to the potential applied on the first power supply line, and the voltage across both ends of the capacitor fluctuates depending on such fluctuation. Accordingly, the voltage adjustment unit maintains the voltage across both ends of the capacitor, so that such fluctuation can be avoided.

According to the second aspect of the power converter of the present invention, the first and second switching elements can function as configuring elements of the converter.

According to the fourth aspect of the power converter of the present invention, the first and third switching elements configure a bi-directional switch. Furthermore, as the capacitor functions as the operation power supplies of the first and third switching elements, the number thereof can be reduced compared to when the capacitor is arranged in each.

According to the third and eighth aspects of the power converter of the present invention, the diode inhibits the capacitor from discharging towards the power supply unit. Thus, the discharging of the capacitor can be prevented even if the potential at the other end of the capacitor becomes higher than the potential at one end on the high potential side of the power converting unit by power source abnormality, and the like.

According to the fifth aspect of the power converter of the present invention, the first and third switching elements can function as the configuring elements of the converter, and the second switching element can function as the configuring element of the inverter. Furthermore, the diode inhibits the capacitor from discharging towards the power supply unit. The unnecessary discharging of the capacitor thus can be prevented.

According to the sixth aspect of the power converter of the present invention, the first switching element for selectively connecting one input end to the first and second power supply lines can function as the configuring element of the converter, and the second switching element can function as the inverter. Furthermore, the fifth diode inhibits the capacitor from discharging towards the power supply unit. The unnecessary discharging of the capacitor thus can be prevented.

According to the seventh aspect of the power converter of the present invention, the first and second switching elements and the first and second diodes can function as a bi-directional switching element. Furthermore, it contributes to the realization of the converter capable of regenerating to the input end side.

According to the ninth aspect of the power converter of the present invention, the voltage across both ends of the capacitor can be stabilized in the normal operation.

According to the tenth aspect of the power converter of the present invention, the voltage of one power supply unit and another one power supply unit can be averaged in the normal operation.

The objects, characteristics, aspects and advantages of the present invention will become apparent by reference to the following description and the accompanying drawings.

BRIEF DESCRIPTION OF THE DRAWINGS

FIGS. 1 and 2 are views each showing one example of a conceptual configuration of a power converter;

FIGS. 11 and 12 are views each showing one example of a conceptual configuration of a power converter;

FIG. 14 is a view showing one example of a conceptual configuration of a power converter;

FIG. 17 is a view showing an equivalent circuit; and

FIGS. 18 and 19 are views each showing one example of a conceptual configuration of a power converter.

EMBODIMENTS FOR CARRYING OUT THE INVENTION

First Embodiment

<One Example of Power Converter>

Figure 2:
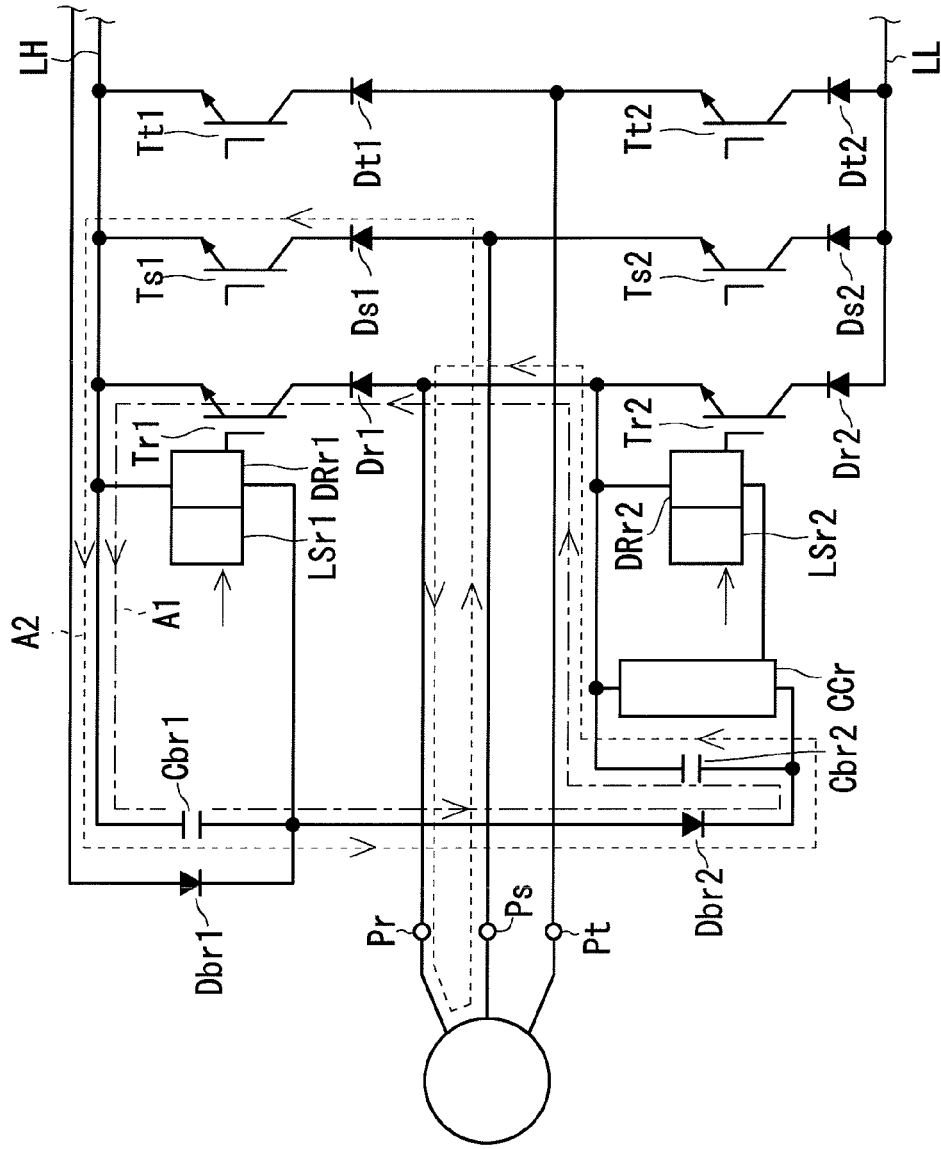

As shown in FIG. 1, the power converter includes a converter 1, a clamp circuit 2, and an inverter 3. The clamp circuit 2 and the inverter 3, however, are not essential requirements herein.

Input ends Pr, Ps, Pt are connected to the converter 1. The converter 1 converts a three-phase alternating current (AC) voltage applied to the input ends Pr, Ps, Pt to a DC voltage, and applies the same to DC power supply lines LH, LL. Describing a more specific configuration, the converter 1 has switching legs for three phases, the r, s, and t phases. The switching leg of the r phase includes a pair of switching elements Tr1, Tr2, and diodes Dr1, Dr2. The switching leg of the s phase includes a pair of switching elements Ts1, Ts2, and diodes Ds1, Ds2. The switching leg of the t phase includes a pair of switching elements Tt1, Tt2, and diodes Dt1, Dt2. The three switching legs are connected in parallel to each other between the DC power supply lines LH, LL. The input end herein refers to the input end of the electrical energy with respect to the power converter, where the input is not limited to the three-phase AC power source.

The switching elements Tx1, Tx2 (x represents r, s, t) include first to third electrodes. The switching elements Tx1, Tx2 make the current flowing between the first electrode and the second electrode conductive/non-conductive. A switch signal (voltage signal and current signal) for controlling conduction/non-conduction of the switching elements Tx1, Tx2 is applied to the third electrode. The first electrode also functions as a control reference electrode, which becomes a reference of the switch signal (e.g., reference potential in the case of voltage signal). The switching elements Tx1, TX2 are, for example, insulated gate bipolar transistors. In the insulated gate bipolar transistor, the first to third electrodes are respectively an emitter electrode, a collector electrode, and a gate electrode. This aspect also applies to the other switching elements to be described later.

The switching element Tx1 and the diode Dx1 are connected in series to each other between the DC power supply line LH and the input end Px. The switching element Tx1 is arranged with the emitter electrode directed towards the DC power supply line LH, and the diode Dx1 is arranged with the anode directed towards the input end Px. The switching element Tx1 is controlled by a control unit (not shown) to connect/disconnect the input end Px and the DC power supply line LH. The switching element Tx2 and the diode Dx2 are connected in series to each other between the DC power supply line LL and the input end Px. The switching element Tx2 is arranged with the emitter electrode directed towards the input end Px, and the diode Dx2 is arranged with the anode directed towards the DC power supply line LL. The switching element Tx2 is controlled by a control unit (not shown) to connect/disconnect the input end Px and the DC power supply line LL.

The switch signal is provided to the switching elements Tx1, Tx2, and the converter 1 converts the three phase AC voltage to the DC voltage. A potential higher than the DC power supply line LL is thus applied to the DC power supply line LH. The diodes Dx1, Dx2 exhibit a reverse blocking ability of a converter. In other words, the converter 1 functions as a current type converter.

The inverter 3 converts the DC voltage between the DC power supply lines LH, LL to the AC voltage, and applies the same to a load 4 (e.g., motor). In the illustration of FIG. 1, the load 4 is drawn as an inductive load including a serial body of a resistor and a reactor.

The inverter 3 includes a switching leg for the three phases, the u, v, w phases. The switching leg of the u phase includes switching elements Tu1, Tu2, and diodes Du1, Du2. The switching leg of the v phase includes switching elements Tv1, Tv2, and diodes Dv1, Dv2. The switching leg of the w phase includes switching elements Tw1, Tw2, and diodes Dw1, Dw2. The three switching legs are connected in parallel to each other between the DC power supply lines LH, LL.

The switching elements Ty1, Ty2 (y represents u, v, w) are, for example, an insulated gate bipolar transistor. The switching elements Ty1, Ty2 are connected in series to each other between the DC power supply lines LH, LL. The switching elements Ty1, Ty2 are both arranged with the emitter electrode directed towards the DC power supply line LL. The diodes Dy1, Dy2 are respectively connected in parallel to the switching elements Ty1, Ty2. The diodes Dy1, Dy2 are both arranged with the anode directed towards the DC power supply line LL.

An output end Py arranged between the switching elements Ty1, Ty2 is connected to the load 4. The switching elements Ty1, Ty2 are respectively controlled by the control unit (not shown).

The switch signal is provided to the switching elements Ty1, Ty2, and the inverter 3 converts the DC voltage to the AC voltage. The diodes Dy1, Dy2 respectively prevent the reverse current from flowing to the switching elements Ty1, Ty2, and also prevent the reverse voltage from being applied to the switching elements Ty1, Ty2.

The clamp circuit 2 includes a switching element S1, a diode D1, and a capacitor C1. The diode D1 and the capacitor C1 are connected in series to each other between the DC power supply lines LH, LL. The diode D1 is arranged with the anode directed towards the DC power supply line LH. The switching element S1 is an insulated gate bipolar transistor, for example, and is connected in parallel to the diode D1. The switching element S1 is arranged with the emitter electrode directed towards the DC power supply line LH.

According to the clamp circuit 2, a regenerative energy from the inverter 3 can be absorbed by the capacitor C1. The clamp circuit 2 at the same time has the effect of the snubber circuit for absorbing the voltage rise between the DC power supply lines LH, LL by the switching.

According to the rectifying function of the diode D1, a voltage of the capacitor C1 is clamped to a maximum value of the voltage between the DC power supply lines LH, LL, where the voltage is not supplied from the capacitor C1 to the inverter 3 if the switching element S1 is non-conductive. Thus, the clamp circuit 2 can be equivalently ignored when the capacitor is charged and the switching element S1 is non-conducted. The converter 1 and the inverter 3 can function as a direct power converter that does not include power accumulating means such as a smoothing capacitor on the DC power supply lines LH, LL. When the switch signal is provided to the switching element S1 thus causing the switching element S1 to be conductive, the DC voltage can be supplied from the capacitor C1 to the inverter 3. The regenerative energy thus can be effectively used. As the capacitor C1 merely needs to have the function of absorbing the regenerative energy, the electrostatic capacitance of the so-called smoothing capacitor is not required, and a small capacitor can be adopted.

The clamp circuit 2 may not be arranged if the load 4 is not an inductive load, but is desirably arranged since the inductance exists in the wiring in the actual power converter.

<Operation Power Supply of Converter 1>

The operation power supply for outputting a switch signal to the switching elements Tx1, Tx2 will now be described with reference to the illustration of FIG. 2. In the illustration of FIG. 2, the illustration of the clamp circuit 2 and the inverter 3 is omitted, and only the operation power supply of the switching elements Tr1, Tr2 is representatively illustrated.

The converter 1 includes drive circuits DRr1, DRr2 for driving the switching elements Tr1, Tr2, respectively, level shift circuits LSr1, LSr2, capacitors Cbr1, Cbr2, a diode Dbr2, and a voltage adjustment unit CCr.

The drive circuits DRr1, DRr2 are respectively connected to the gate electrodes of the switching elements Tr1, Tr2. In the illustration of FIG. 2, the operation power supply is supplied from the capacitor Cbr1 to the drive circuit DRr1. One end of the capacitor Cbr1 is connected to the emitter electrode of the switching element Tr1, and the drive circuit DRr1. The other end of the capacitor Cbr1 is connected to the drive circuit DRr1. This content can be understood as the capacitor Cbr1 for supporting the DC voltage between the relevant one end and the relevant other end, and serving as an operation power supply outputting a switch signal to the switching element Tr1. The other capacitors can be similarly understood, and hence the redundant description will be omitted below.

The capacitor Cbr1 is charged with the other end side as a high potential through a method to be described later or an arbitrary method. The DC power source may be arranged in place of the capacitor Cbr1, and the DC power source may function as the operation power supply of the switching element Tr1.

The voltage across both ends of the capacitor Cbr2 is supplied to the drive circuit DRr2 as the operation power supply through the voltage adjustment unit CCr. One end of the capacitor Cbr2 is connected to the emitter electrode of the switching element Tr2 (i.e., point between switching element Tr2 and input end Pr), and the drive circuit DRr2. The other end of the capacitor Cbr2 is connected to the voltage adjustment unit CCr.

The voltage adjustment unit CCr adjusts the voltage across both ends of the capacitor Cbr2, and is connected to the drive circuit DRr2. For instance, the voltage adjustment unit CCr is a clamp circuit.

The diode Dbr2 is connected between the other end of the capacitor Cbr2 and the other end of the capacitor Cbr1 (i.e., one end on high potential side). The diode Dbr2 is arranged with the anode directed towards the capacitor Cbr1. The diode Dbr2 prevents the capacitor Cbr2 from discharging towards the capacitor Cbr1.

As can be recognized from the normal operation of the converter 1, to be described later, the potential applied to the DC power supply line LH is greater than or equal to the phase voltage Vr applied to the input end Pr. Thus, if the voltages across both ends of the capacitors Cbr1, Cbr2 are about the same with respect to each other, the potential of one end on the high potential side of the capacitor Cbr1 is greater than the potential of one end on the high potential side of the capacitor Cbr2. Therefore, the capacitor Cbr2 is ideally not discharged towards the capacitor Cbr1 in the normal operation of the converter 1. The diode Dbr2 thus is not an essential requirement. However, the diode Dbr2 is desirably arranged since the discharging may occur by power source abnormality, and the like, for example.

The level shift circuits LSr1, LSr2 are connected to the drive circuits DRr1, DRr2 on the side opposite to the switching elements Tr1, Tr2, respectively. The level shift circuits LSr1, LSr2 appropriately shift the potential level of the switch signal created by the common control circuit (not shown), for example, in accordance with the potential of the drive circuit Dry1, and supplies the same to the drive circuits DRr1, DRr2, respectively. The level shift circuits connected to the other drive circuits, to be described later, are similar, and thus the detailed description will be omitted below.

<Charging Operation of Capacitor>

The capacitor Cbr1 is charged prior to the normal operation of the present power converter. One example of a specific charging method will be described later. The charging is not necessary if the capacitor Cbr1 is replaced with the DC power source.

The capacitor Cbr2 is also charged prior to the normal operation of the power converter. Specifically, the capacitor Cbr2 can be charged using the charges accumulated in the capacitor Cbr1 by conducting the switching element Tr1. This is because the current flows through the path A1 including the capacitor Cbr1, the diode Dbr2, the capacitor Cbr2, and the switching element Tr1 according to the conduction of the switching element Tr1. Such path A1 can be recognized as the path through which the current flows only in the direction from the capacitor Cbr1 towards the capacitor Cbr2 without passing both input ends Pr, Ps by the conduction of the switching element Tr1. In this case, the voltage is not applied to the input end Pr, so that the potential of the capacitor Cbr2 becomes a value in which the voltage drop of the diodes Dbr2, Dr1 and the switching element Tr1 is subtracted from the voltage of the capacitor Cbr1 with the DC power supply line LH as the reference potential.

As illustrated in FIG. 2, the charging of the capacitor Cbr2 is executed after the charging of the capacitor Cbr1 by adopting the capacitor Cbr1 as the operation power supply of the switching element Tr1. This is because the operation power supply cannot be supplied to the switching element Tr1 (more specifically, drive circuit DRr1) before the charging of the capacitor Cbr1, and it cannot be conducted. This aspect is similar in other capacitors, to be described later.

Therefore, the capacitor Cbr2 is charged and adapted to function as the operation power supply for outputting a switch signal to the switching element Tr2. The DC power source thus does not need to be arranged for the switching element Tr2, and the manufacturing cost can be reduced. Furthermore, since the transistor Tr1 is conducted, as will be described later, in the normal operation of the converter, the capacitor Cbr2 is charged even during such normal operation. The electrostatic capacitance required by the capacitor Cbr2 is thus reduced.

<Normal Operation of Converter 1>

The input ends Pr, Ps, Pt are connected to the three-phase AC power source, and the three-phase AC voltage is applied to the input ends Pr, Ps, Pt. The converter 1 converts the three-phase AC voltage to the DC voltage in the normal operation. In such converter 1, the potential applied to the input end Px fluctuates with respect to the potential applied to the DC power supply line LH, and the voltage of the capacitor Cbx2 may fluctuate depending on such fluctuation. The fluctuation of the voltage across both ends will be specifically described below. The fluctuation of the voltage across both ends of the capacitor mentioned in other power converters is also triggered by the fluctuation of the potential of the input end Px with respect to the potential applied to the DC power supply line LH.

Figure 3:
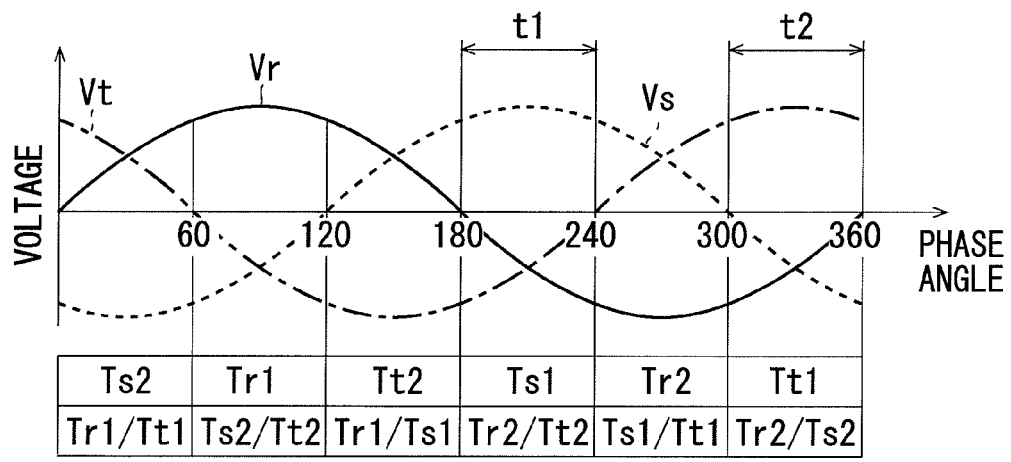
FIG. 3 is a view showing one example of switching of a three-phase AC power source and the converter.

The switching elements Tx1, Tx2 are controlled in the following manner, for example, in the normal operation of the converter 1. In other words, a set of one of the switching elements Tx1 and one of the switching elements Tx2 that does not form a pair therewith is selectively conducted. One example of such switching is shown in FIG. 3 in a form of a table. The first row of the table shows the switching element that is always conducted in each period corresponding to the three-phase AC voltage, and the second row shows the switching elements that are exclusively conducted with respect to each other in each period. For instance, with reference to FIG. 3, the switching element Ts1 is always conducted, and the switching elements Tr2, Tt2 are exclusively and alternately switched and conducted with respect to each other in period t1 in which only the phase voltage Vs is positive. The current flowing through the converter 1 in period t1 will be representatively considered below.

Figure 4:
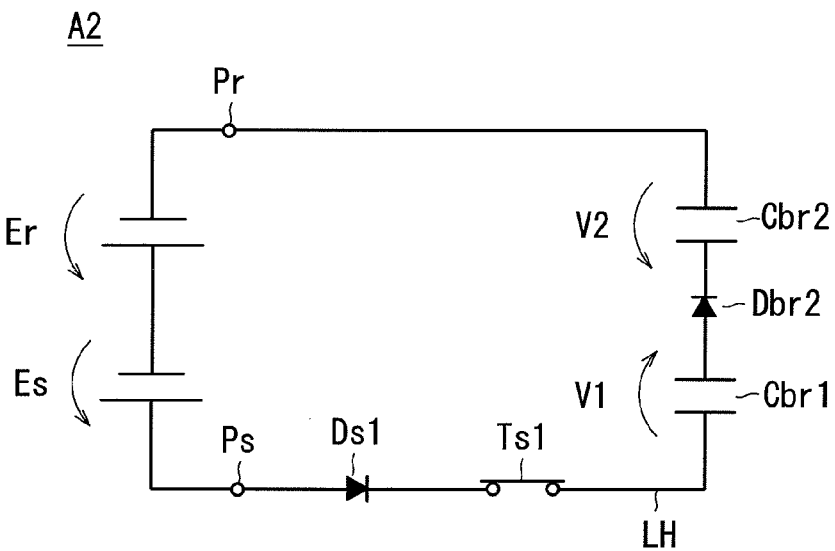
FIG. 4 is a view showing an equivalent circuit.

In period t1, the switching element Ts1 is conducted. The current may flow from the capacitor Cbr1 to the capacitor Cbr2 through the input ends Pr, Ps according to such conduction. This will be described with reference to the equivalent circuit shown in FIG. 4.

In period t1, the phase voltage Vr is negative and thus is shown as the DC power source Er whose low potential is directed towards the input end Pr side. In period t1, the phase voltage Vs is positive and thus is shown as the DC power source Es whose high potential end directed towards the input end Ps side. One end on the high potential side of the DC power source Er and one end on the low potential side of the DC power source Es (i.e., neutral point of phase voltages Vr, Vs) are connected to each other. The DC voltages of the DC power sources Er, Es are also respectively referred as Er (=−Vr), Es (=Vs). One end on the low potential side of the DC power source Er is connected to one end on the low potential side of the capacitor Cbr2 through the input end Pr, and one end on the high potential side of the DC power source Es is connected to one end on the low potential side of the capacitor Cbr1 through the input end Ps, the diode Ds1, and the switching element Ts1. The diode Ds1 is arranged with the anode directed towards the input end Pr. The diode Dbr2 is connected between the one ends on the high potential side of the capacitors Cbr1, Cbr2. The diode Dbr2 is arranged with the anode directed towards the capacitor Cbr1.

According to the charging operation described above, each voltage V1, V2 across both ends of the capacitors Cbr1, Cbr2 is initially about the same with respect to each other in the normal operation. The potential of the input end Ps seen from the input end Pr becomes (Er+Es), and the potential (Er+Es+V1) of the anode of the diode Dbr2 seen from the input end Pr is greater than the potential (V2) of the cathode if the voltage drop of the diode Ds1 and the switching element Ts1 is ignored. Therefore, the diode Dbr2 is conducted. The current flows through the path A2 including the AC power source, the input ends Pr, Ps, the capacitors Cbr1, Cbr2, the switching element Ts1, and the diodes Ds1, Dbr2 according to such conduction. The path A2 can be understood as the path through which the current flows from the capacitor Cbr1 to the capacitor Cbr2 through the input ends Pr, Ps.

The voltage V2 across both ends of the capacitor Cbr2 may increase by about a line voltage Vrs (=phase voltage Vs−phase voltage Vr=Es+Er) by such current. As the phase voltages Vr, Vs fluctuate with time, the voltage V2 across both ends may fluctuate in correspondence therewith.

According to the present converter 1, the voltage adjustment unit CCr adjusts the voltage V2 across both ends. Therefore, in the normal operation, the voltage fluctuation of the capacitor Cbr2 dependent on the phase voltage of the three-phase AC power source can be avoided, and a stable voltage can be supplied to the drive circuit DRr2. The drive conditions of the switching element are thus uniformized, and the drive circuit does not break from overvoltage.

In the illustration of FIGS. 1 and 2, the emitter electrodes of the transistors Tr1, Ts1, Tt1 are directly connected to the DC power supply line LH. The DC power supply line LH thus functions as the common potential of the transistors Tr1, Ts1, Tt1. The capacitor Cbr1 thus can function as the operation power supply of the switching elements Ts1, Tt1. More specifically, the capacitor Cbr1 is connected to the drive circuits (not shown) for driving the switching elements Ts1, Tt1, respectively. The capacitor Cbr1 supplies the operation power supply to such drive circuits. The number of capacitors thus can be reduced.

<One Example of Charging Operation of Capacitor Cbr1 and Operation Power Supply of Switching Elements Ty1, Ty2>

Figure 5:
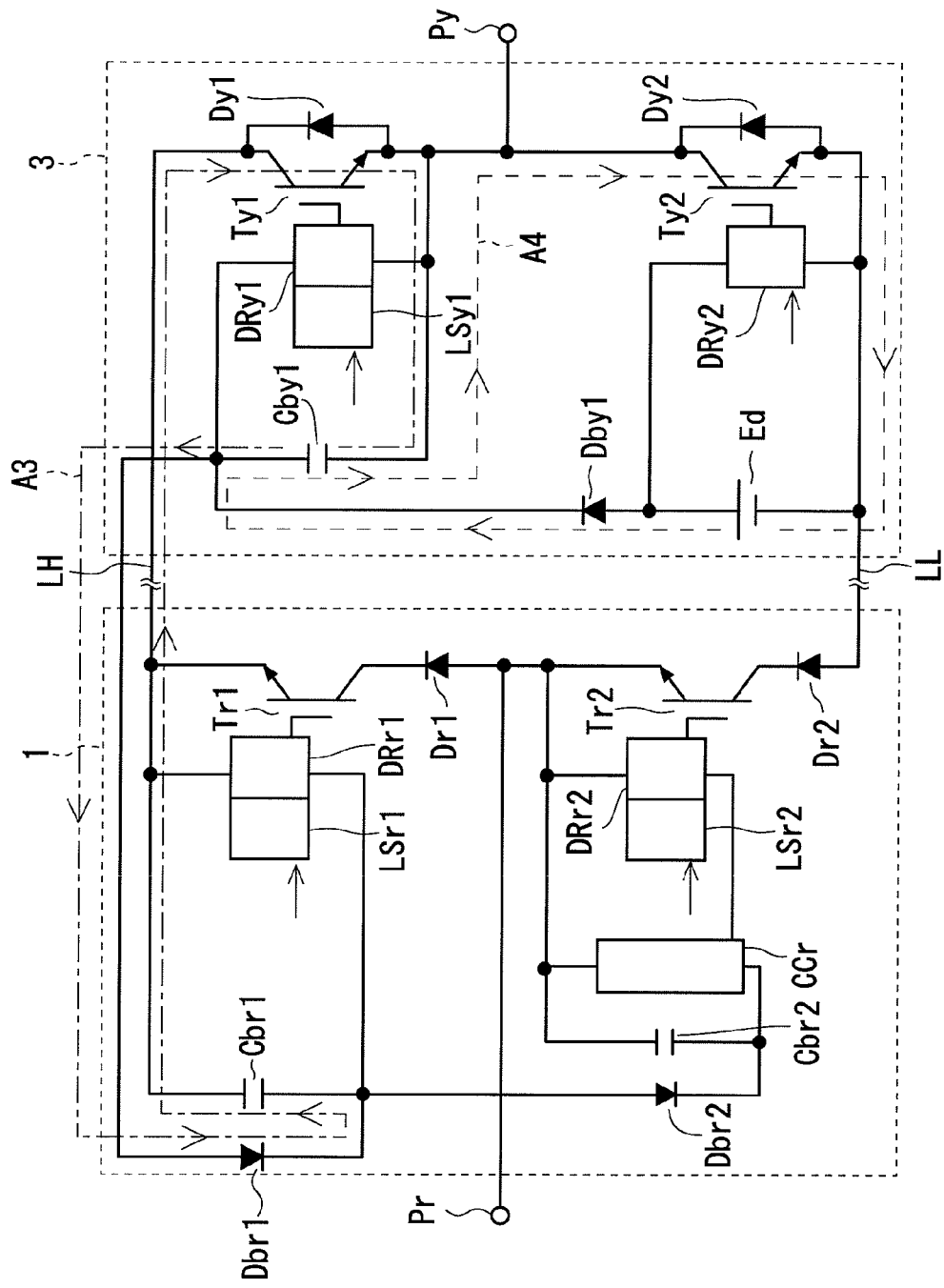
FIG. 5 is a view showing one example of a conceptual configuration of a power converter.

One example of the charging operation of the capacitor Cbr1 will be described herein. A technique of charging the capacitor Cbr1 using the operation power supply of the switching element of the inverter 3 will be described with reference to FIG. 5. In FIG. 5, only the switching leg of the r phase is shown in the converter 1, and only the switching leg of one phase is shown in the inverter 3.

The inverter 3 includes the drive circuits DRy1, DRy2, the capacitor Cby1, the level shift circuit LSy1, the DC power source Ed, and the diode Dby1. The drive circuit DRy1 is connected to the gate electrode of the switching element Ty1 to drive the switching element Ty1. The level shift circuit LSy1 is connected to the drive circuit DRy1.

One end on the low potential side of the capacitor Cby1 is connected to the emitter electrode of the switching element Ty1 and the drive circuit DRy1, and one end on the high potential side is connected to the drive circuit DRy1. The capacitor Cby1 functions as the operation power supply of the drive circuit DRy1, that is, the operation power supply for outputting a switch signal to the switching element Ty1. The DC power source may be arranged in place of the capacitor Cby1. The charging of the capacitor Cby1 will be described in detail later.

The diode Dbr1 is arranged between one ends on the high potential side of the capacitors Cby1, Cbr1. The diode Dbr1 is arranged with the cathode directed towards the capacitor Cbr1. The diode Dbr1 prevents the capacitor Cbr1 from discharging towards the capacitor Cby1.

According to such configuration, the capacitor Cbr1 can be charged using the charges accumulated in the capacitor Cby1 by conducting the switching element Ty1. This is because the current flows through a path A3 including the capacitor Cby1, the diode Dbr1, the capacitor Cbr1, and the switching element Ty1, according to such conduction.

The drive circuit DRy2 is connected to the gate electrode of the switching element Ty2 to drive the switching element Ty2. One end on the low potential side of the DC power source Ed is connected to the emitter electrode of the switching element Ty2 and the drive circuit DRy2, and one end on the high potential side is connected to the drive circuit DRy2. The DC power source Ed functions as the operation power supply of the drive circuit DRy2, that is, the operation power supply for outputting a switch signal to the switching element Ty2.

The diode Dby1 is arranged between one end on the high potential side of the DC power source Ed and one end on the high potential side of the capacitor Cby1. The diode Dby1 is arranged with the cathode directed towards the capacitor Cbr1. The diode Dby1 prevents the capacitor Cby1 from discharging towards the DC power source Ed.

According to such configuration, the capacitor Cby1 can be charged using the DC power source Ed as the power source by conducting the switching element Ty2. This is because the current flows through a path A4 including the DC power source Ed, the diode Dby1, the capacitor Cby1, and the switching element Ty1 according to such conduction.

The anode of the diode Dbr1 may be connected to one end on the high potential side of the DC power source Ed. In such a case, the capacitor Cbr1 may be charged with the DC power source Ed as the power source by the conduction of the switching elements Ty1, Ty2.

The capacitors Cbr1, Cbr2 are charged using the charges accumulated in the capacitors Cby1, Cbr1, respectively, and thus the voltage across both ends of the capacitors Cby1, Cbr1 lowers in such charging. Each capacitor is thus preferably charged repeatedly in the charging operation prior to the normal operation.

<Another Example of Power Converter>

Figure 6:
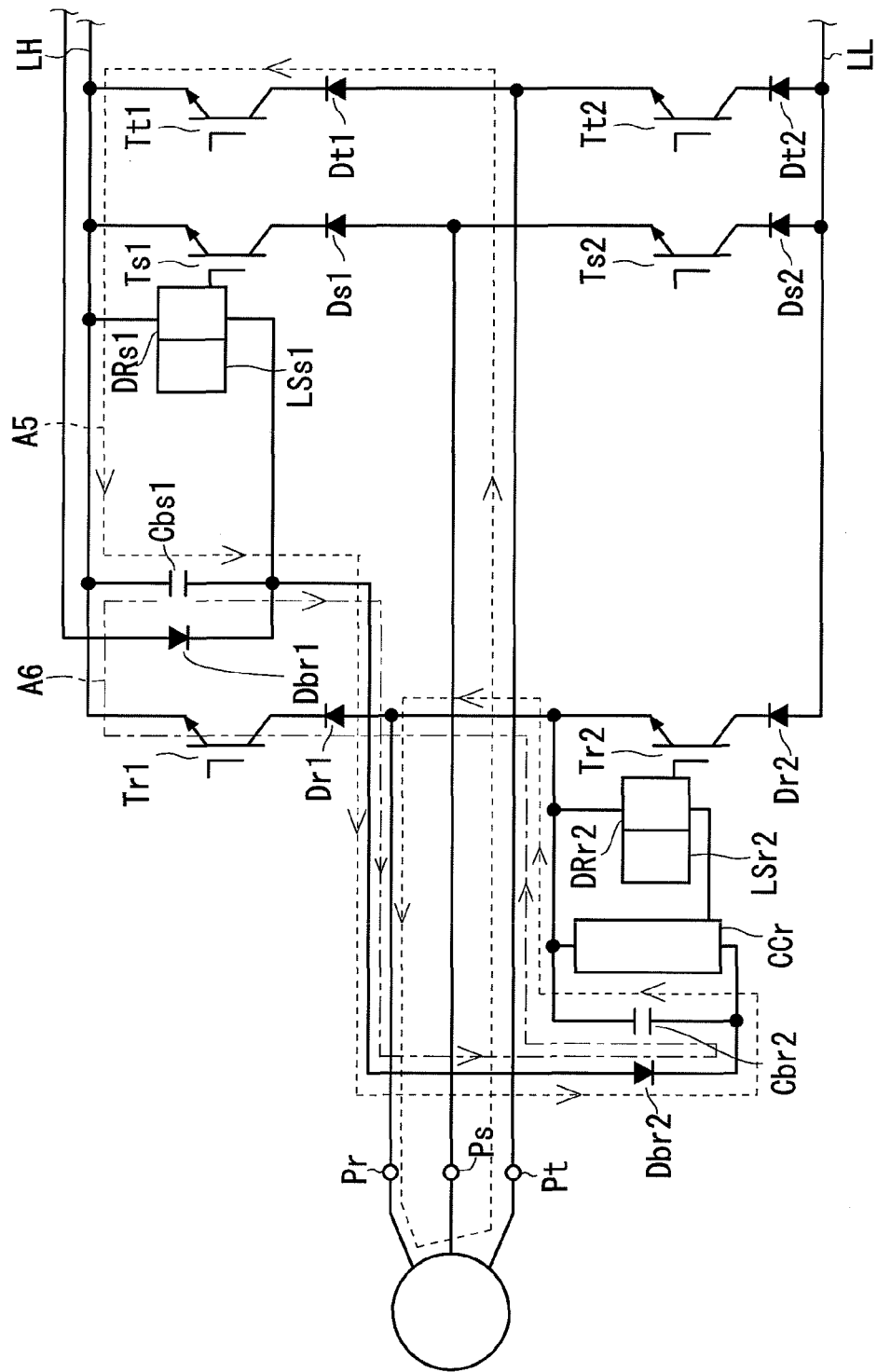
FIGS. 6 to 8 are views each showing one example of a conceptual configuration of a converter.

In the illustration of FIG. 6, the anode of the diode Dbr2 is connected to one end on the high potential side of the capacitor Cbs1. One end on the low potential side of the capacitor Cbs1 is directly connected to the DC power supply line LH. The capacitor Cbs1 functions as the operation power supply for outputting a switch signal to the switching element Ts1. More specifically, the voltage across both ends of the capacitor Cbs1 is applied to the drive circuit DRs1. The drive circuit DRs1 is connected to the gate electrode of the switching element Ts1 to drive the switching element Ts1. The level shift circuit LSs1 is connected to the drive circuit DRs1. In such configuration, the capacitor Cbs1 may function as the operation power supply of the switching elements Tr1, Tt1, as described above.

In the charging operation prior to the normal operation of the converter 1, the capacitor Cbr2 can be charged using the charges accumulated in the capacitor Cbs1 by conducting the switching element Tr1. This is because the current flows through a path A6 including the capacitor Cbs1, the diode Dbr2, the capacitor Cbr2, the diode Dr1 and the switching element Tr1, according to such conduction. The path A6 is a path through which the current flows only in the direction from the capacitor Cbr1 towards the capacitor Cbr2 without passing both input ends Pr, Ps by the conduction of the switching element Tr1.

The normal operation will now be described. The current flowing to the power converter in period t2 in the illustration of FIG. 3 will be representatively described. In period t2, only the phase voltage Vt is positive, the switching element Tt1 is always conducted, and the switching elements Tr2, Ts2 are exclusively conducted to each other. In such period t2, the current may flow from the capacitor Cbs1 to the capacitor Cbr2. This will be described with reference to the equivalent circuit of FIG. 4. In the equivalent circuit of FIG. 4, the capacitor Cbr1 is reread as the capacitor Cbs1, the input end Ps as the input end Pt, the phase voltage Vs as the phase voltage Vt, the DC power source Es as the DC power source Et, and the path A2 as the path A5 for understanding.

In the normal operation, the voltage V1 across both ends of the capacitor Cbs1 and the voltage V2 across both ends of the capacitor Cbr2 are initially about the same with respect to each other. In period t2, the phase voltage Vr is negative, and the phase voltage Vt is positive. Therefore, ignoring the voltage drop of the switching element Tt1 and the diodes Dt1, Dbr2, the potential (Er+Et+V1) of the anode of the diode Dbr2 seen from the input end Pr is higher than the potential (V2) of the cathode. Therefore, the diode Dbr2 is conducted. The current flows through the path A5 from the capacitor Cbs1 to the capacitor Cbr2 according to such conduction. The voltage V2 across both ends of the capacitor Cbr2 thus can fluctuate. The path A5 can be understood as the path through which the current flows from the capacitor Cbs1 to the capacitor Cbr2 through the input ends Pr, Pt.

According to the present power converter, the voltage adjustment unit CCr adjusts the voltage V1 across both ends of the capacitor Cbr2, so that such fluctuation can be avoided and effects similar to those of the previously described example can be obtained.

In the following description, all the paths described in the charging operation prior to the normal operation can be understood as the paths through which the current flows from the first capacitor to the second capacitor without passing the input end by the conduction of the switching element. Furthermore, all the paths described in the normal operation can be understood as the paths through which the current flows from the first capacitor to the second capacitor through the input end by the conduction of at least a predetermined switching element.

<Another Example of Power Converter>

Figure 7:
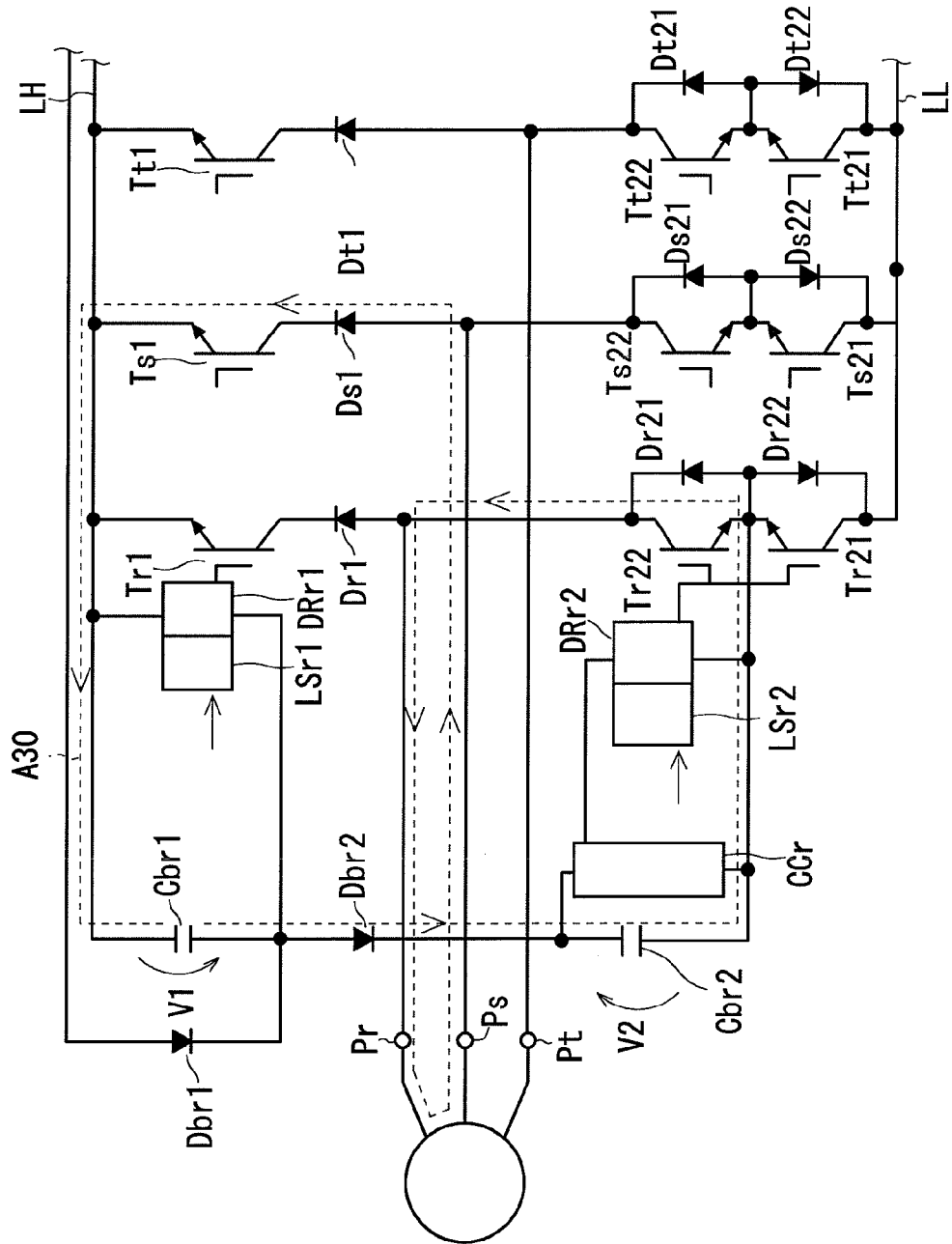

The power converter shown in FIG. 7 differs from the power converter shown in FIG. 2 in the configuration of the converter 1. More specifically, the switching elements Tx21, Tx22 (x represents r, s, t) and the diodes Dx21, Dx22 are arranged in place of the switching element Tx2 and the diode Dx2.

The switching elements Tx21, Tx22 are one-directional control switching elements for conducting/non-conducting only the current flowing from the second electrode to the first electrode. For instance, in the case of the insulated gate bipolar transistor, only the current flowing from the collector electrode to the emitter electrode (so-called current in forward direction) is conducted/non-conducted. In the insulated gate bipolar transistor, for example, the current (so-called current in reverse direction) does not flow from the first electrode (emitter electrode) to the second electrode (collector electrode). Such switching element is also referred to as a one-directional conduction switching element. An MOS (Metal-Oxide-Semiconductor) field effect transistor, for example, structurally has a parasitic diode conducted in reverse direction, and thus the current flows from the first electrode (source electrode) to the second electrode (drain electrode).

The switching elements Tx21, Tx22 are connected in series to each other between the DC power supply line LL and the input end Px. The emitter electrodes of the switching elements Tx21, Tx22 are connected to each other. The diode Dx21 is connected in parallel with the switching element Tx22 with the anode directed towards the DC power supply line LL. The diode Dx22 is connected in parallel with the switching element Tx21 with the cathode directed towards the DC power supply line LL.

According to such converter 1, the switching elements Tx11, Tx12 and the diodes Dx12, Dx22 can configure a bi-directional switch. Furthermore, the emitter electrodes of the switching elements Tx21, Tx22 are connected to each other. Therefore, the operation power supplies of the switching elements Tx21, Tx22 can be made common, as shown in FIG. 7. The operation power supply will be described in more detail below using the switching elements Tr21, Tr22 by way of example.

The switching elements Tr21, Tr22 are driven by the drive circuit DRr2. The drive circuit DRr2 is commonly connected to the gate electrodes of the switching elements Tr21, Tr22. The level shift circuit LSr2 is connected to the drive circuit DRr2.

The voltage across both ends of the capacitor Cbr2 is supplied to the drive circuit DRr2 as the operation power supply through the voltage adjustment unit CCr. One end of the capacitor Cbr2 is connected to the emitter electrodes of the switching elements Tr21, Tr22 (i.e., point between the input end Pr and the switching element Tr21 through the diode Dr21) and the drive circuit DRr2. The other end of the capacitor Cbr2 is connected to the voltage adjustment unit CCr.

The other end of the capacitor Cbr2 is connected to one end on the high potential side of the capacitor Cbr1 through the diode Dbr2. The diode Dbr2 is arranged with the cathode directed towards the capacitor Cbr2. The diode Dbr2 prevents the capacitor Cbr2 from discharging towards the capacitor Cbr1. The diode Dbr2 is not an essential requirement but is desirably arranged, similar to the diode Dbr2 of FIG. 2.

According to such configuration, the capacitor Cbr2 can be charged using the charges accumulated in the capacitor Cbr1 by conducting the switching element Tr1. This is because the current flows through the path including the capacitor Cbx1, the diode Dbr2, the capacitor Cbr2, the diode Dr21, and the switching element Tr1, according to such conduction.

Therefore, the operation power supplies of the switching elements Tr21, Tr22 can be made common and the capacitor Cbr2 is adopted for such operation power supply, so that the number of DC power sources can be reduced.

In such converter 1 as well, the potential of the input end Pr fluctuates with respect to the potential of the DC power supply line LH. Therefore, the voltage across both ends of the capacitor Cbr2 may fluctuate, similar to the converter 1 of FIG. 2. A case in which the phase voltage Vs is greater than the phase voltage Vr will be described in detail below, by way of example.

The potential of the input end Pr seen from the input end Ps is potential E (=phase voltage Vs–phase voltage Vr). The voltages V1, V2 across both ends of the capacitors Cbr1, Cbr2 are values of the same extent, and thus the potential (E+V1) of the anode of the capacitor Cbr2 seen from the input end Ps is greater than the potential (V2) of the cathode seen from the input end Ps if the voltage drop of the diodes Ds1, Dr21, and the switching elements Ts1, Tr22 is ignored, for simplification. The diode Dbr2 is thereby conducted. Thus, the current may flow through a path A30 including the AC power source, the input ends Pr, Ps, the capacitors Cbr1, Cbr2, the diodes Ds1, Dbr21, and the switching element Ts1. The voltage V2 across both ends of the capacitor Cbr2 thus may fluctuate according to the single phase AC voltage.

According to the present converter 1, the voltage adjustment unit CCr adjusts the voltage V2 across both ends. Therefore, in the normal operation, the voltage fluctuation of the capacitor Cbr2 dependent on the three-phase AC voltage can be suppressed, and effects similar to the previously shown example may be obtained.

<Another Example of Power Converter>

Figure 8:
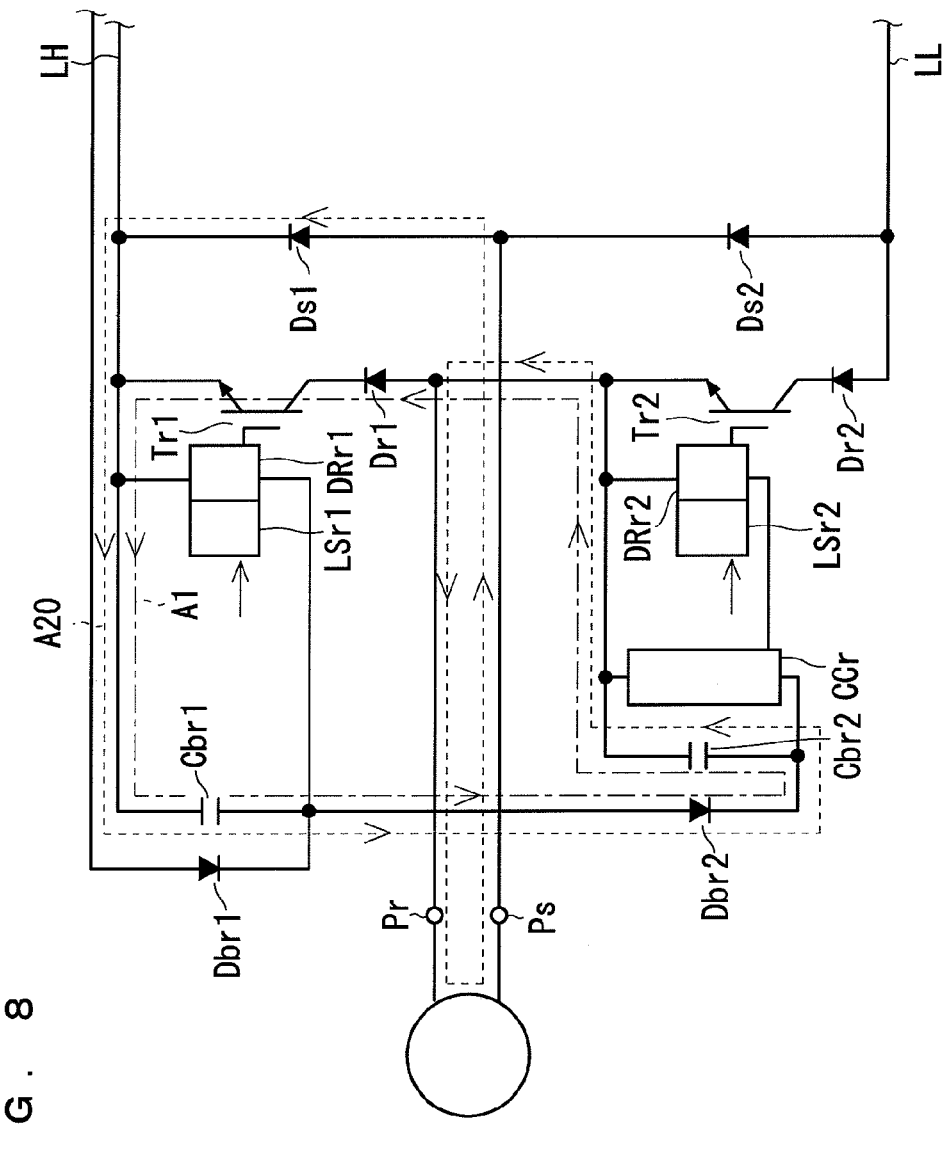

A power converter shown in FIG. 8 differs from the power converter shown in FIG. 2 in the configuration of the converter 1. The input ends Pr, Ps are connected to the converter 1. The single phase AC voltage is applied to the input ends Pr, Ps. The converter 1 includes the switching elements Tr1, Tr2, and the diodes Dr1, Dr2, Ds1, Ds2. The switching elements Tr1, Tr2, and the diodes Dr1, Dr2 are the same as those shown in FIG. 2. The diode Ds1 is arranged with the cathode directed towards the DC power supply line LH at between the input end Pr and the DC power supply line LH. The diode Ds2 is arranged with the anode directed towards the DC power supply line LL at between the input end Ps and the DC power supply line LL.

The configuration of the operation power supply for the switching elements Tr1, Tr2 is the same as that shown in FIG. 2, and thus the detailed description will be omitted.

In such converter 1 as well, the potential of the input end Pr fluctuates with respect to the potential of the DC power supply line LH, and thus the voltage V2 across both ends of the capacitor Cbr1 may fluctuate, similar to the converter 1 of FIG. 2. This can be understood as because the current flows through a path A20 including the AC power source, the input ends Pr, Ps, the capacitors Cbr1, Cbr2, and the diodes Dbr1, Ds1, for example. The voltage adjustment unit CCr adjusts the voltage V2 across both ends. Therefore, the voltage fluctuation of the capacitor Cbr2 dependent on the single phase AC voltage can be suppressed in the normal operation.

Second Embodiment

Figure 9:
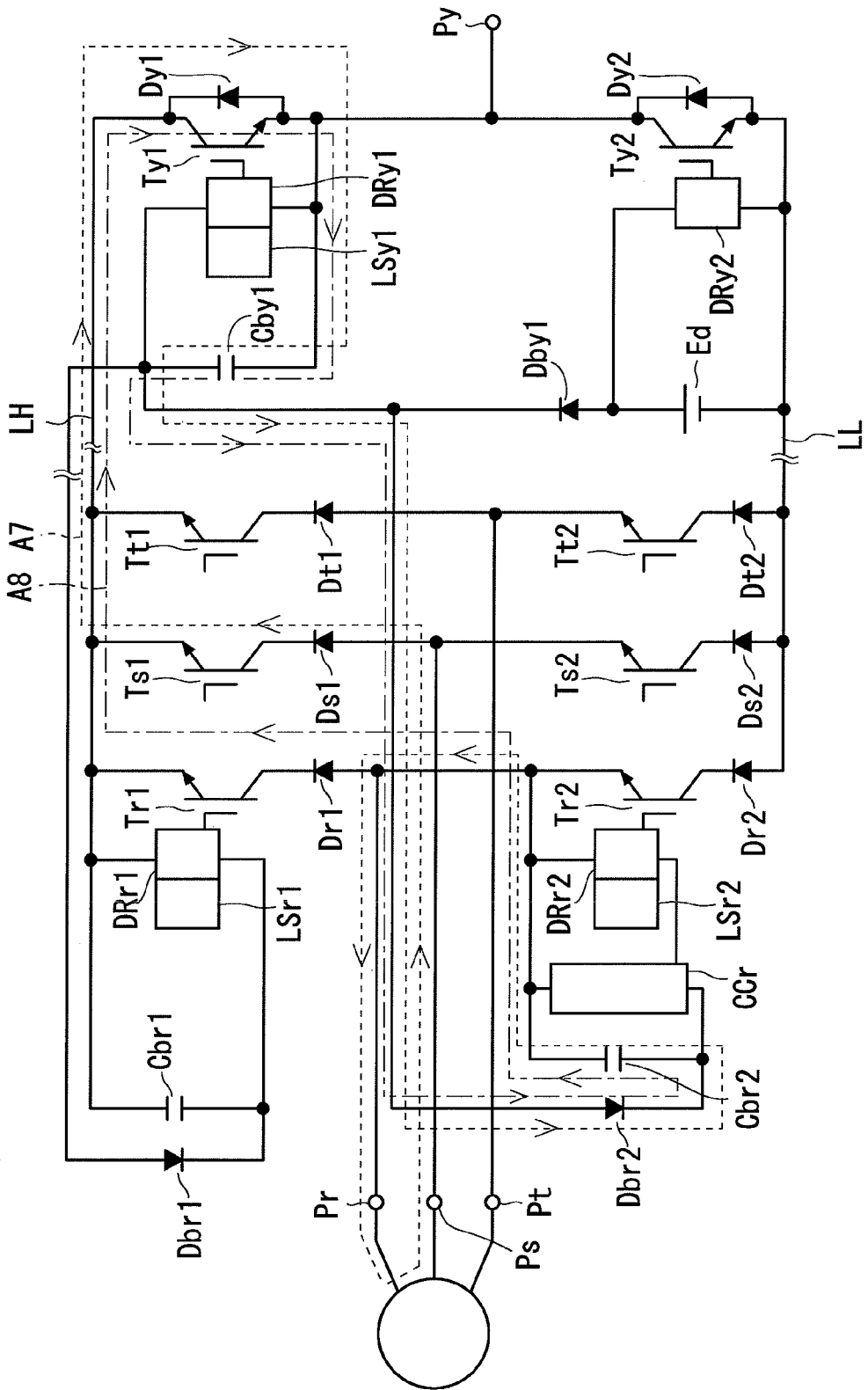
FIG. 9 is a view showing one example of a conceptual configuration of a power converter.

The power converter shown in FIG. 9 differs from the power converter shown in FIG. 2 in the connecting relationship of the diode Dbr2. In the power converter of FIG. 9, the anode of the diode Dbr2 is connected to one end on the high potential side of the capacitor Cby1.

The capacitor Cbr2 can be charged using the charges accumulated in the capacitor Cby1 by conducting the switching elements Tr1, Ty1 in the charging operation prior to the normal operation. This is because the current flows through a path A8 including the capacitor Cby1, the diode Dbr2, the capacitor Cbr2, the diode Dr1, and the switching elements Tr1, Ty1 by such conduction.

<Normal Operation of Power Converter>

The converter 1 is switched according to the three-phase AC voltage applied to the input ends Pr, Ps, Pt, similar to the first embodiment (see e.g., FIG. 3). The inverter 3 is switched according to the three-phase AC voltage (voltage command value) to be expected to output to the output ends Pu, Pv, Pw. The current flowing through the present power converter in the period t1 will be representatively considered below.

In period t1, the current flows from the capacitor Cby1 to the capacitor Cbr2 through the input ends Pr, Ps. This will be described with reference to the equivalent circuit shown in FIG. 10.

Figure 10:
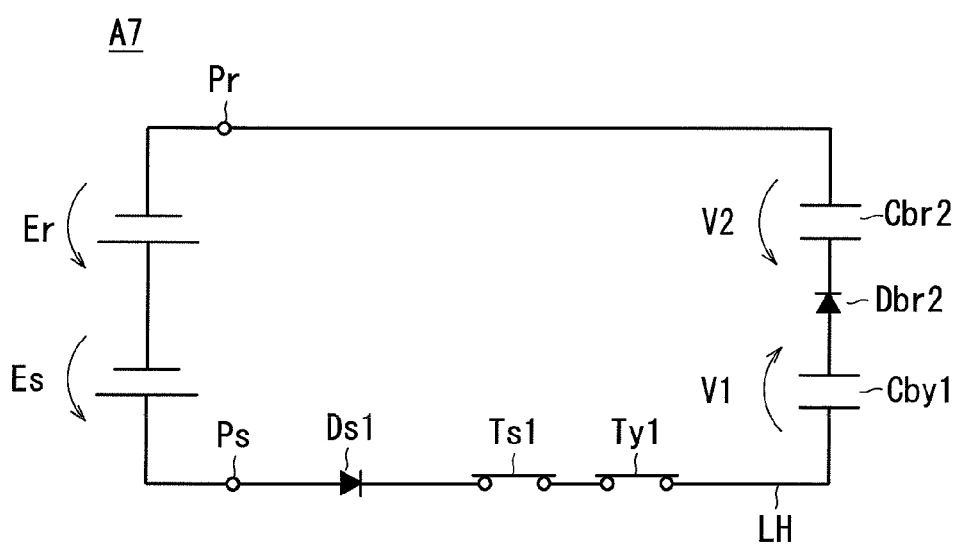
FIG. 10 is a view showing an equivalent circuit.

The equivalent circuit of FIG. 10 further includes the switching element Ty1, and includes the capacitor Cby1 in place of the capacitor Cbr1, compared to the equivalent circuit of FIG. 3. The switching element Ty1 is connected between the switching element Ts1 and the capacitor Cby1 so as to be in series therewith.

The switching element Ty1 is controlled according to the voltage command value, as described above, and is conducted at least for every period (hereinafter referred to as first period) of the voltage command value. Since the three-phase AC voltage used in the control of the converter 1 and the voltage command value used in the control of the inverter 3 are independent from each other, the first period is selected irrespective of the period (hereinafter referred to as second period) of the three-phase AC voltage. The period in which the switching element Ty1 is conducted for every first period overlaps period t1 in which it repeatedly appears for every second period at any timing due to the difference in the first period and the second period. In other words, the switching element Ty1 is conducted in any period t1. Therefore, the switching element Ty1 is shown in the conducted state in the illustration of FIG. 10.

Furthermore, the voltages V1, V2 across both ends of the capacitors Cby1, Cbr2 are initially about the same with respect to each other in the normal operation according to the charging operation described above. The potential of the input end Ps seen from the input end Pr becomes (Er+Es), and the potential (Er+Es+V1) of the anode of the diode Dbr2 seen from the input end Pr is greater than the potential (V2) of the cathode if the voltage drop of the diode Ds1 and the switching elements Ts1, Ty1 is ignored. Therefore, the diode Dbr2 is conducted, and the current flows through the path A7 including the power source, the input ends Pr, Ps, the capacitors Cby1, Cbr2, the switching elements Ts1, Ty1, and the diodes Ds1, Dbr2.

As the voltage V2 across both ends of the capacitor Cbr2 fluctuates depending on the phase voltages Vr, Vs by such current, the voltage adjustment unit CCr adjusts the voltage V2 across both ends according to the present converter 1. Therefore, the voltage fluctuation of the capacitor Cbr2 dependent on the phase voltage of the three phase AC power source can be avoided in the normal operation, and effects similar to the previously described example can be obtained.

Third Embodiment

Figure 11:
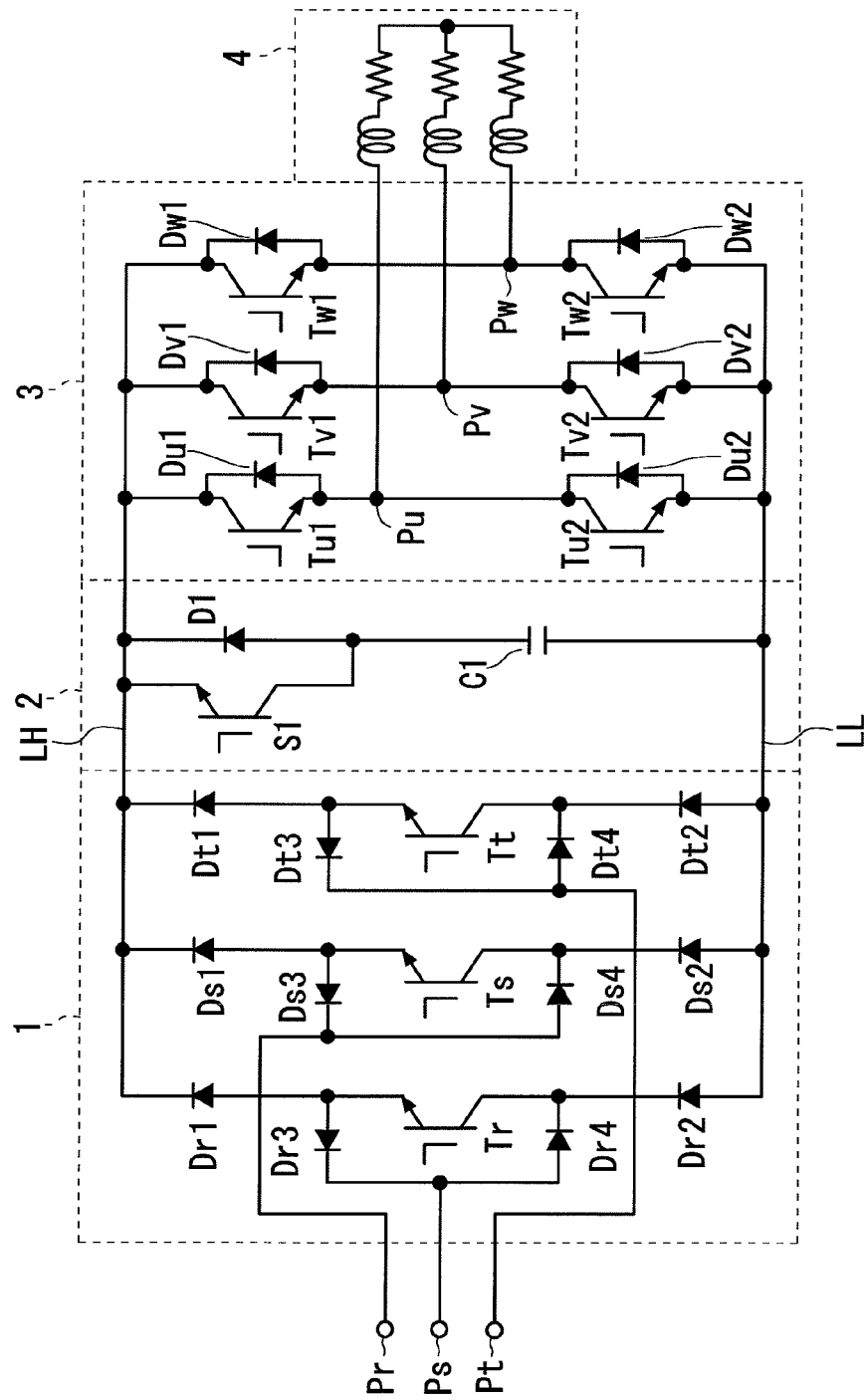

A power converter of FIG. 11 differs from the power converter of FIG. 1 in the configuration of the converter 1. The clamp circuit 2 may not be arranged if the load 4 is not an inductive load, but is desirably arranged since the inductance exists in the wiring in the actual power converter.

The converter 1 has switching legs for the r, s, and t phases. The switching leg of the r phase includes a switching elements Tr and diodes Dr1 to Dr4. The switching leg of the s phase includes a switching elements Ts and diodes Ds1 to Ds4. The switching leg of the t phase includes a switching elements Tt, and diodes Dt1 to Dt4. The switching legs of the r, s, and t phases are connected in parallel to each other between the DC power supply lines LH, LL.

The switching elements Tx (x represents r, s, t) is, for example, an insulated gate bipolar transistor. The switching elements Tx and the diodes Dx1, Dx2 are connected in series to each other between the DC power supply lines LH, LL. The diode Dx1 is arranged on the DC power supply line LH side with respect to the switching element Tx, and the diode Dx2 is arranged on the DC power supply line LL side with respect to the switching element Tx. The switching element Tx is arranged with the emitter electrode directed towards the DC power supply line LH, and the diodes Dx1, Dx2 are arranged with the cathode directed towards the DC power supply line LH. The diodes Dx1, Dx2 exhibit a reverse blocking ability of the converter 1. The anode of the diode Dx3 is connected between the switching element Tx and the diode Dx1, and the cathode is connected to the input end Px. The anode of the diode Dx4 is connected to the input end Px, and the cathode is connected between the switching element Tx and the diode Dx2. The switching element Tx is controlled by the control unit (not shown), and connects/disconnects the input end Px and the DC power supply line LH, LL.

According to such converter 1, the number of switching elements can be reduced, and hence the manufacturing cost can be reduced.

<Operation Power Supply of Switching Element of Converter 1>

The operation power supplies of the switching elements Tx, Ty1, Ty2 will now be described with reference to FIG. 12. In the illustration of FIG. 12, the operation power supply for the switching leg of the r phase of the converter 1 is representatively shown, and only one switching leg of the inverter 3 is shown. The operation power supplies of the switching element Ty1, Ty2 are similar to the description made with reference to FIG. 1, and thus the description will be omitted.

The converter 1 includes the drive circuit DRr, the level shift circuit LSr, the capacitor Cbr, the diode Dbr, and the voltage adjustment unit CCr. The drive circuit DRr is connected to the gate electrode of the switching element Tr to drive the switching element Tr. The level shift circuit LSr is connected to the drive circuit DRr.

The voltage across both ends of the capacitor Cbr is supplied to the drive circuit DRr through the voltage adjustment circuit CCr as the operation power supply. One end of the capacitor Cbr is connected to the emitter electrode of the switching element Tr and the drive circuit DRr. The other end of the capacitor Cbr is connected to the power source adjustment unit CCr.

The voltage adjustment unit CCr adjusts the voltage across both ends of the capacitor Cbr, and is connected to the drive circuit DRr2.

The other end of the capacitor Cbr is connected to one end on the high potential side of the capacitor Cby1 through the diode Dbr. The diode Dbr is arranged with the cathode directed towards the capacitor Cbr. The diode Dbr prevents the capacitor Cbr from discharging towards the capacitor Cby1.

The capacitor Cbr is charged prior to the normal operation of the power converter. Specifically, the capacitor Cbr can be charged by conducting the switching element Ty1. This is because the current flows through a path A10 including the capacitors Cby1, Cbr, the diodes Dbr, Dr1, and the switching element Ty1 by the conduction of the switching element Ty1. Therefore, the DC power source does not need to be used for the switching element Tr, and the manufacturing cost can be reduced. Furthermore, the electrostatic capacitance required by the capacitor Cbr can be reduced since the capacitor Cbr is charged for every conduction of the switching element Ty1 even during the normal operation.

<Normal Operation of Power Converter>

The converter 1 is controlled based on the three-phase AC voltage applied to the input ends Pr, Ps, Pt, and converts the three-phase AC voltage to the DC voltage. In such normal operation, the switching element Tx is controlled in the following manner, for example. In other words, one of the switching elements Tx and one of the other switching elements Tx are selectively conducted. In one example of such switching, the reference symbols Tx1, Tx2 shown in FIG. 3 are respectively reread as the switching element Tx for understanding. For instance, the switching element Ts is always conducted and the switching elements Tr, Tt are exclusively and alternately conducted with each other in period t1 in which the phase voltage Vs is positive and the phase voltages Vr, Vt are negative. The current flowing through the power converter in period t1 will be representatively reviewed below.

Figure 13:
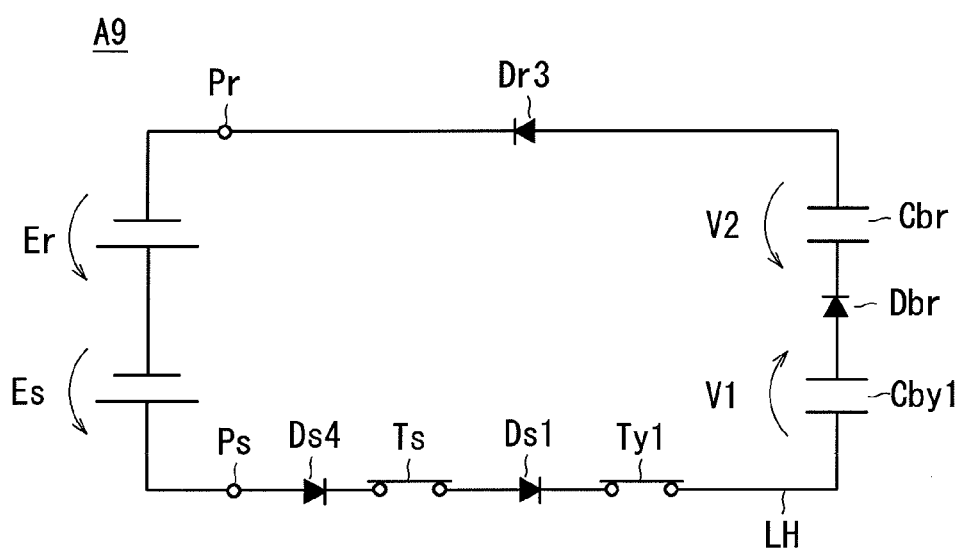
FIG. 13 is a view showing an equivalent circuit.

The switching element Ts is conducted in period t1. The current may flow from the capacitor Cbr1 to the capacitor Cbr2 through the input ends Pr, Ps according to such conduction. This will be described with reference to the equivalent circuit shown in FIG. 13.

The phase voltage Vr is negative and thus is shown as the DC power source Er whose low potential is directed towards the input end Pr side, and the phase voltage Vs is positive and thus is shown as the DC power source Es whose high potential is directed towards the input end Ps side. One end on the high potential side of the DC power source Er and one end on the low potential side of the DC power source Es (i.e., neutral point of phase voltages Vr, Vs) are connected to each other. One end on the low potential side of the DC power source Er is connected to one end on the low potential side of the capacitor Cbr through the input end Pr and the diode Dr3. The diode Dr3 is arranged with the cathode directed towards the input end Pr side. One end on the high potential side of the DC power source Es is connected to one end on the low potential side of the capacitor Cby1 through the input end Ps, the diodes Ds4, Ds1, and the switching elements Ts, Ty1. The diodes Ds4, Ds1 are arranged with the anode directed towards the input end Ps side. The diode Dbr is connected between the one ends on the high potential side of the capacitors Cby1, Cbr. The diode Dbr is arranged with the anode directed towards the capacitor Cby1.

The switching element Ty1 may be conducted in any period t1, similar to the second embodiment. Therefore, the switching element Ty1 is shown as conducted in FIG. 13.

According to the charging operation described above, each voltage V1, V2 across both ends of the capacitors Cby1, Cbr is initially about the same with respect to each other in the normal operation. The potential of the input end Ps seen from the input end Pr becomes (Er+Es), and the potential (Er+Es+V1) of the anode of the diode Dbr seen from the input end Pr is greater than the potential (V2) of the cathode if the voltage drop of the diodes Ds1, Ds4 and the switching elements Ts, Ty1 is ignored. Therefore, the diode Dbr is conducted, and the current flows through a path A9 including the capacitors Cbr, Cby1, the switching elements Ts1, Ty1, and the diodes Ds1, Ds4, Dbr.

As the voltage V2 across both ends of the capacitor Cbr increases by such current, the voltage adjustment unit CCr adjusts the voltage V2 across both ends according to the present converter 1. Therefore, in the normal operation, the voltage fluctuation of the capacitor Cbr dependent on the phase voltage of the three-phase AC power source can be avoided, and effects similar to the previously described example can be obtained.

Fourth Embodiment

A power converter shown in FIG. 14 differs from the power converter shown in FIG. 1 in the presence or absence of the clamp circuit 2 and in the configuration of the converter 1. The present power converter does not include the clamp circuit 2. As will be hereinafter described, this is because the converter 1 has a configuration capable of regenerating to the input end Pr, Ps, Pt side (hereinafter also referred to as power source side), but this does not inhibit the installation of the clamp circuit for protection and the like at the time of operation abnormality.

The switching leg of the r phase includes switching elements Tr11, Tr12, Tr21, Tr22 and diodes Dr11, Dr12, Dr21, Dr22. The switching leg of the s phase includes switching elements Ts11, Ts12, Ts21, Ts22 and diodes Ds11, Ds12, Ds21, Ds22. The switching leg of the t phase includes switching elements Tt11, Tt12, Tt21, Tt22 and diodes DM, Dt12, Dt21, Dt22. The switching legs of the r phase, the s phase, and the t phase are connected in parallel to each other between the DC power supply lines LH, LL.

The switching elements Tx11, Tx12, Tx21, Tx22 (x represents r, s, t) are one-directional control switching elements for conducting/non-conducting only the current flowing from the second electrode to the first electrode. For instance, the switching elements Tx11, Tx12, Tx21, Tx22 are insulated gate bipolar transistors. The insulated gate bipolar transistors conducts/non-conducts only the current (so-called current in forward direction) flowing from the collector electrode to the emitter electrode. In the insulated gate bipolar transistor, for example, the current (so-called current in reverse direction) does not flow from the first electrode (emitter electrode) to the second electrode (collector electrode). Such switching element is also referred to as a one-directional conduction switching element. An MOS (Metal-Oxide-Semiconductor) field effect transistor, for example, structurally has a parasitic diode conducted in reverse direction, and thus the current flows from the first electrode (source electrode) to the second electrode (drain electrode).

The switching element Tx11 and the diode Dx11, the switching element Tx12 and the diode Dx12, the switching element Tx21 and the diode Dx21, and the switching element Tx22 and the diode Dx22 are respectively connected in series with each other. The switching elements Tx11, Tx21 are arranged with the emitter electrode directed towards the DC power supply line LH, and the diodes Dx11, Dx21 are arranged with the cathode directed towards the DC power supply line LH. The switching elements Tx12, Tx22 are arranged with the emitter electrode directed towards the DC power supply line LL, and the diodes Dx12, Dx22 are arranged with the cathode directed towards the DC power supply line LL.

A serial body of the switching element Tx11 and the diode Dx11, and a serial body of the switching element Tx12 and the diode Dx12 are connected in parallel to each other between the input end Px and the DC power supply line LH. A serial body of the switching element Tx21 and the diode Dx21, and a serial body of the switching element Tx22 and the diode Dx22 are connected in parallel to each other between the input end Px and the DC power supply line LL. The switching elements Tx11, Tx12 are controlled by a control unit (not shown) to connect/disconnect the input end Px and the DC power supply line LH. The switching elements Tx21, Tx22 are controlled by a control unit (not shown) to connect/disconnect the input end Px and the DC power supply line LL.

In such configuration, the switching elements Tx11, Tx12, and the diodes Dx11, Dx12 configure a so-called bi-directional switching element. Similarly, the switching elements Tx21, Tx22, and the diodes Dx21, Dx22 configure a so-called bi-directional switching element. Therefore, the converter 1 can flow current from the DC power supply line LH, LL towards the input end Px. In other words, the regenerative energy from the inverter 3 can be regenerated towards the power supply.

<Operation Power Supply of Switching Elements Tx11, Tx12>

The operation power supply for outputting a switch signal to the switching elements Tx11, Tx12 will now be described with reference to FIG. 15.

The drive circuits DRx11, DRx12 are connected to the gate electrodes of the switching elements Tx11, Tx12, respectively. The level shift circuits LSx11, LSx12 are connected to the drive circuits DRx11, DRx12, respectively.

The voltage across both ends of the capacitor Cbx11 is supplied to the drive circuit DRx11 as the operation power supply. The diode Dbx11 is arranged between the capacitors Cbx11, Cby1. The capacitor Cbx11 and the diode Dbx11 are the same as the capacitor Cbx1 and the diode Dbx1 in the first embodiment, and thus the detailed description will be omitted.

The voltage across both ends of the capacitor Cbx12 is supplied to the drive circuit DRx12 through the voltage adjustment circuit CCx as the operation power supply. One end of the capacitor Cbx12 is connected to the emitter electrode of the switching element Tx12, and the drive circuit DRx12. The other end of the capacitor Cbx12 is connected to the voltage adjustment circuit CCx.

The voltage adjustment circuit CCx adjusts the voltage across both ends of the capacitor Cbx12, and is connected to the drive circuit DRx12.

The other end of the capacitor Cbx12 is connected to one end on the high potential side of the capacitor Cbx11 through the diode Dbx12. The diode Dbx12 prevents the capacitor Cbx12 from discharging towards the capacitor Cbx11.

In the normal operation of the converter 1, the potential applied to the DC power supply line LH is greater than or equal to the phase voltage Vx applied to the input end Px. If the voltages across both ends of the capacitors Cbx11, Cbx12 are about the same with respect to each other, the potential of one end on the high potential side of the capacitor Cbx11 is greater than the potential of one end on the high potential side of the capacitor Cbx12. Therefore, the capacitor Cbx12 ideally does not discharge towards the capacitor Cbx11 in the normal operation of the converter 1. The diode Dbx12 is thus not an essential requirement. However, the diode Dbx12 is desirably arranged since the discharging may occur from power source abnormality, for example.

In the charging operation prior to the normal operation, the capacitor Cbx12 can be charged using the charges accumulated in the capacitor Cbx11 by conducting the switching element Tx11. This is because the current flows through a path A11 including the capacitor Cbx11, the diode Dbx12, the capacitor Cbx12, the diode Dx11, and the switching element Tx11 by such conduction.

Therefore, the capacitor Cbx12 is charged and adapted to function as an operation power supply for outputting a switch signal to the switching element Tx12. Therefore, the DC power supply does not need to be provided for the switching element Tx12, and the manufacturing cost can be reduced. Furthermore, the capacitor Cbx12 is also charged through the path A11 in the normal operation since the switching element Tx11 is also conducted in the normal operation of the converter 1. The electrostatic capacitance required by the capacitor Cbx12 thus can be reduced.

The other end (high potential side) of the capacitor Cbx11 becomes a high potential always higher than the other end (high potential side) of the capacitor Cbx12, and hence the diode Dbx12 may not be arranged.

<Normal Operation of Converter 1>

The converter 1 is controlled based on the three-phase AC voltage applied to the input ends Pr, Ps, Pt in the power running operation. In the power running operation, the current flows from the DC power supply line LH to the DC power supply line LL through the inverter 3 and the load 4. In the regenerating operation, on the other hand, the current flows from the DC power supply line LH to the DC power supply line LL through the converter 1 and the power source to regenerate the regenerative energy of the load 4 to the power source. The power running operation will be described herein by way of example.

In the power running operation, the switching elements Tx11, Tx21 are controlled. The switching elements Tx12, Tx22 do not contribute at all to the operation in the power running operation, and thus may always be non-conducted.

The switching elements Tx12, Tx22 may be controlled with the switch signal same as the switching element Tx11, Tx21 to simplify the control.

The switching elements Tx11, Tx21 are controlled similar to the switching elements Tx1, Tx2 according to the first embodiment, for example. In other words, the switching in which the switching elements Tx1, Tx2 are replaced with the switching elements Tx11, Tx21 is carried out in the illustration of FIG. 3. The current flowing through the converter 1 in period t1 will be representatively considered below.

In period t1, the switching element Ts11 is conducted. The current flows from the capacitor Cbr11 to the capacitor Cbr12 through the input ends Pr, Ps by such conduction (see also FIG. 16). This will be described with reference to the equivalent circuit shown in FIG. 17.

In period t1, the phase voltage Vr is negative and thus is shown as the DC power source Er whose low potential is directed towards the input end Pr side. In period t1, the phase voltage Vs is positive and thus is shown as the DC power source Es whose high potential is directed towards the input end Ps side. One end on the high potential side of the DC power source Er and one end on the low potential side of the DC power source Es (i.e., neutral point of phase voltages Vr, Vs) are connected to each other. One end on the low potential side of the DC power source Er is connected to one end on the low potential side of the capacitor Cbr12 through the input end Pr, and one end on the high potential side of the DC power source Es is connected to one end on the low potential side of the capacitor Cbr11 through the input end Ps, the diode Ds11, and the switching element Ts11. The diode Ds11 is arranged with the anode directed towards the input end Pr. The diode Dbr12 is connected between one ends on the high potential side of the capacitors Cbr11, Cbr12. The diode Dbr12 is arranged with the anode directed towards the capacitor Cbr11.

According to the charging operation described above, each voltage V1, V2 across both ends of the capacitors Cbr11, Cbr12 is initially about the same with respect to each other in the normal operation. The potential of the input end Ps seen from the input end Pr becomes (Er+Es), and the potential (Er+Es+V1) of the anode of the diode Dbr12 is greater than the potential (V2) of the cathode if the voltage drop of the diode Ds11 and the switching element Ts11 is ignored. Therefore, the diode Dbr12 is conducted. The current flows through the path A12 including the AC power source, the input ends Pr, Ps, the capacitors aril, Cbr12, the switching element Ts11, and the diodes Ds11, Dbr12 according to such conduction.

The voltage V2 across both ends of the capacitor Cbr12 may fluctuate depending on the phase voltages Vr, Vs by such current, and hence the voltage adjustment unit CCr adjusts the voltage V2 across both ends according to the present converter 1. Therefore, the voltage fluctuation of the capacitor Cbr2 dependent on the phase voltage of the three-phase AC power source can be avoided in the normal operation, and effects similar to the previously described example can be obtained.

Figure 15:
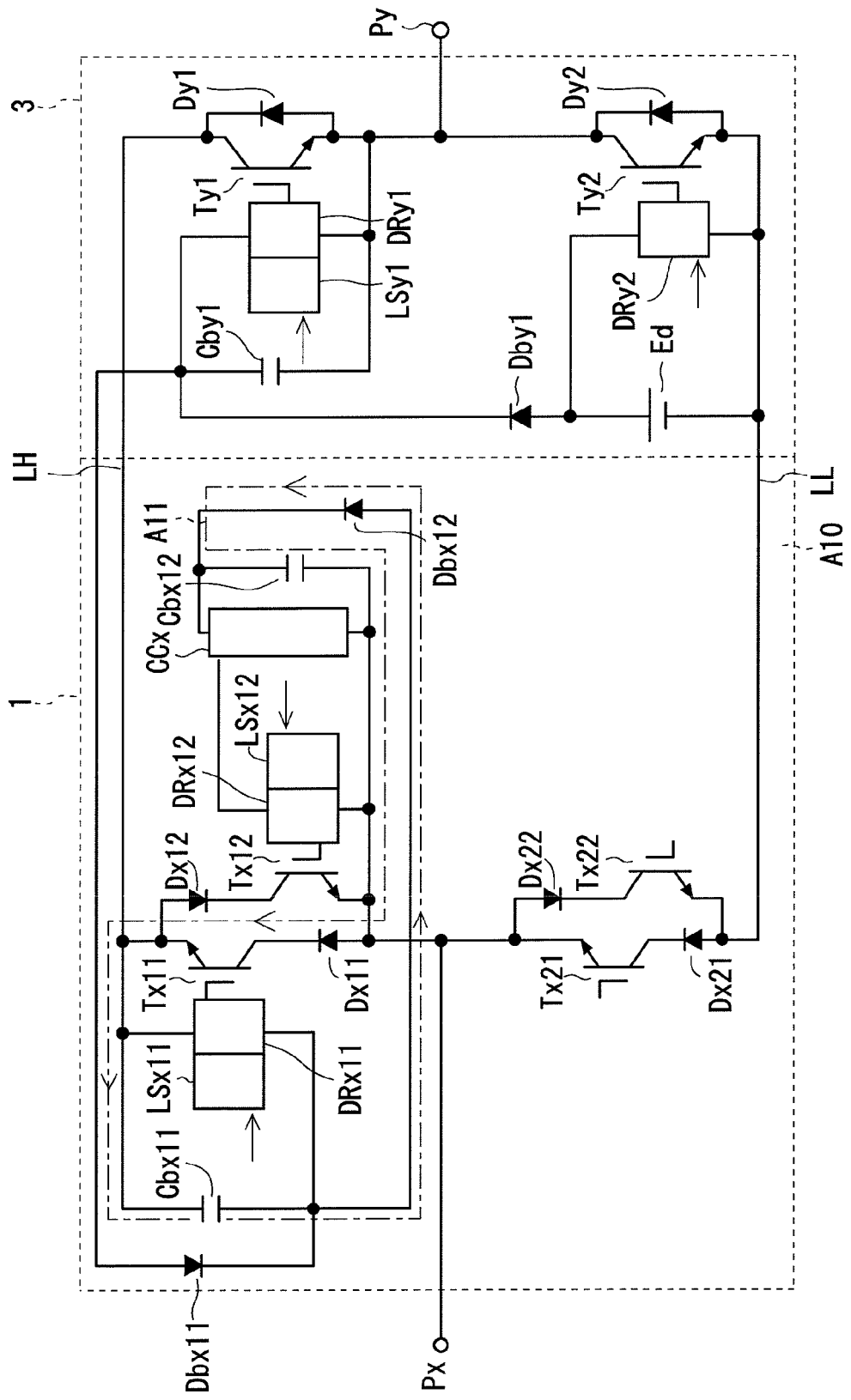
FIG. 15 is a view showing one example of a conceptual configuration of a power converter.
Figure 16:
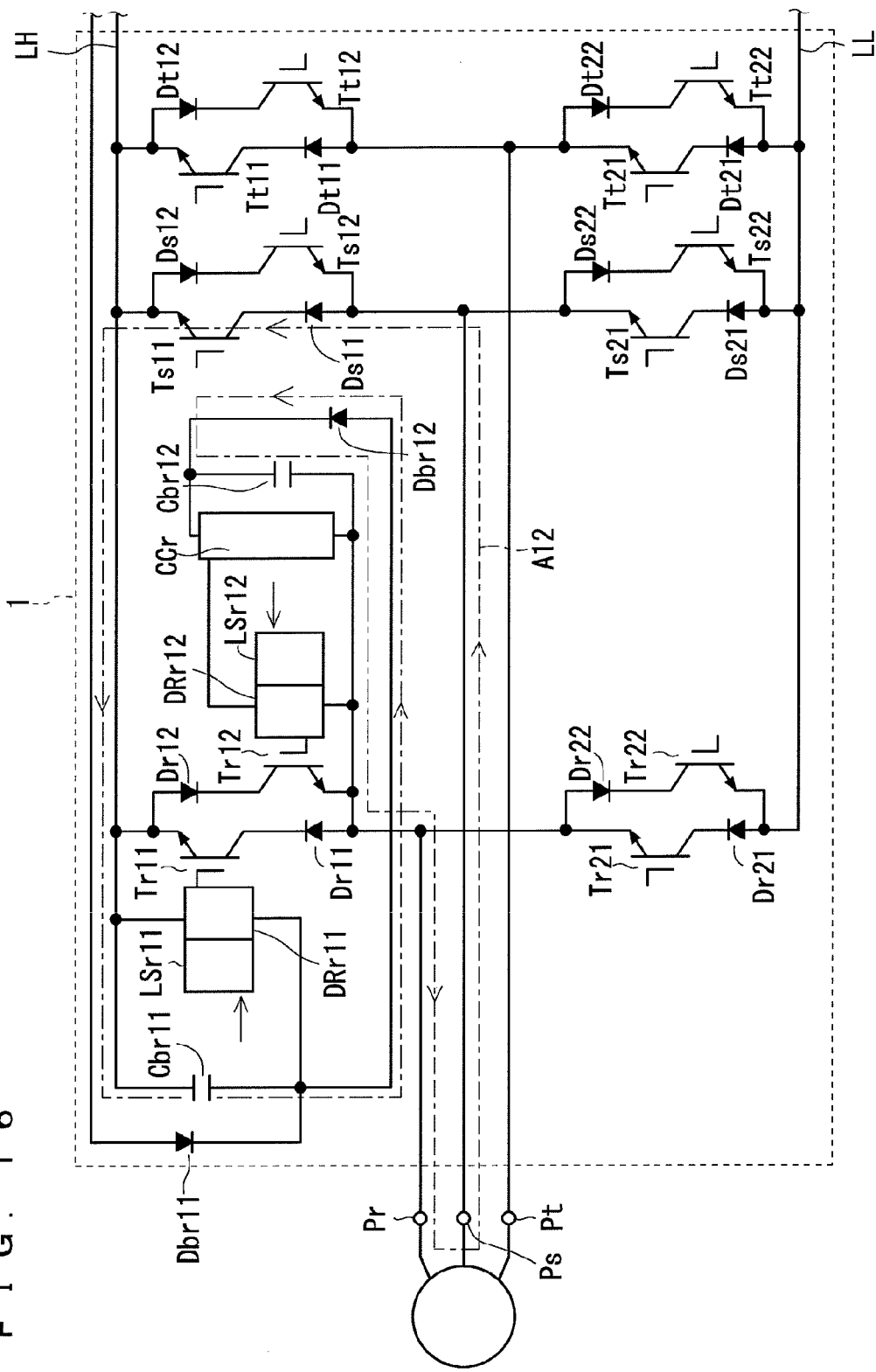
FIG. 16 is a view showing one example of a conceptual configuration of a converter.

In the circuits shown in FIGS. 14 to 16, the bi-directional switch can be configured in a form of connecting the switching element Tr11 and the switching element Tr12, where the operation is similar in such case as well, and the same effects can be obtained.

Fifth Embodiment

The power converter shown in FIG. 18 differs from the power converter shown in FIG. 5 in the connecting destination of the capacitor Cbx1. In FIG. 18, one switching leg of the converter 1 is shown, and two switching legs (only switching element on upper side) of the inverter 3 are shown.

In the illustration of FIG. 18, one end on the high potential side of the capacitor Cbx1 is connected to one ends on the high potential side of the capacitors Cbu1, Cbv1 through the diodes Dbx11, Dbx12, respectively. The diodes Dbx11, Dbx12 are respectively arranged with the cathode directed towards the capacitor Cbx1. The diodes Dbx11, Dbx12 respectively prevent the capacitor Cbx1 from discharging towards the capacitors Cbu1, Cbv1.

According to such power converter, the capacitor Cbx1 can be charged using the charges accumulated in the capacitor Cbu1 by the conduction of the switching element Tu1. This is because the current flows through a path A21 including the capacitor Cbu1, the diode Dbx11, the capacitor Cbx1, and the switching element Tu1 by the conduction of the switching element Tu1. Furthermore, the capacitor Cbx1 can be charged using the charges accumulated in the capacitor Cbv1 by the conduction of the switching element Tv1. This is because the current flows through a path A22 including the capacitor Cbv1, the diode Dbx12, the capacitor Cbx1, and the switching element Tv1 by the conduction of the switching element Tv1.

Therefore, the capacitor Cbx1 is charged by conducting at least one of the switching elements Tu1, Tv1. Therefore, the opportunity the capacitor Cbx1 will be charged increases in the normal operation. In other words, the influence of the state of conduction/non-conduction of the switching elements Tu1, Tv1 is averaged, and the voltage across both ends of the capacitor Cbx1 can be stabilized.

In the illustration of FIG. 18, one end on the high potential side of the capacitor Cbx1 is connected to the two capacitors Cbu1, Cbv1 through the diodes Dbx11, Dbx12, respectively, but is not limited thereto, and may be connected to three capacitors Cbu1, Cbv1, Cbw1 through the diodes, respectively. The capacitor Cbx2 may be charged from the capacitors Cbu1, Cbv1 through the diode.

Figure 19:
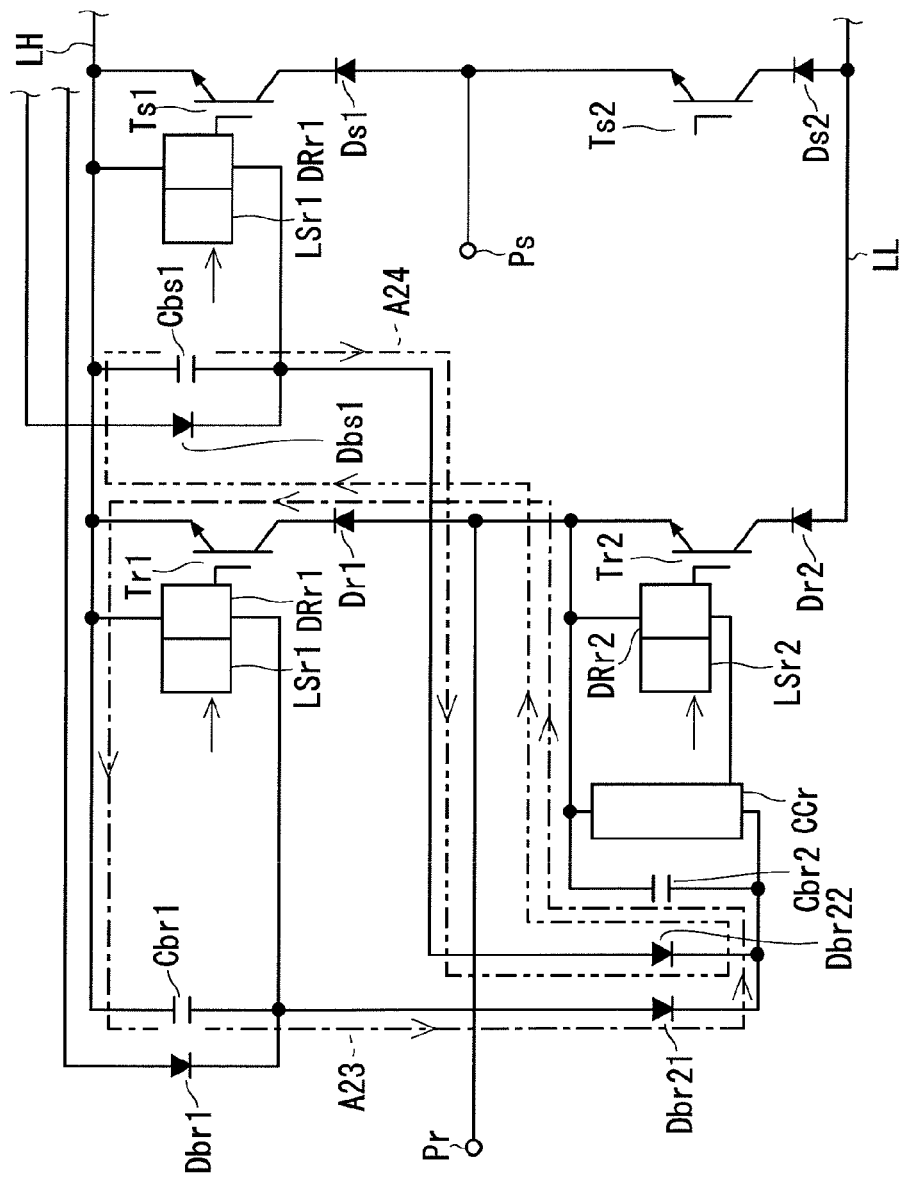

The power converter shown in FIG. 19 differs from the power converter shown in FIG. 2 in the connecting destination of the capacitor Cbr2. In FIG. 19, only two switching legs of the converter 1 are shown.

In the illustration of FIG. 19, one end on the high potential side of the capacitor Cbr2 is connected to one ends on the high potential side of the capacitor Cbr1, Cbs1, respectively, through the diodes Dbr21, Dbr22. The diodes Dbr21, Dbr22 are arranged with the cathode directed towards the capacitor Cbr2. The diodes Dbr21, Dbr22 prevent the capacitor Cbr2 from discharging towards the capacitors Cbr1, Cbs1.

According to such power converter, the capacitor Cbr2 can be charged using the charges accumulated in the capacitors Cbr1, Cbs1 by the conduction of the switching element Tr1. This is because the current flows through a path A23 including the capacitor Cbr1, the diode Dbr21, the capacitor Cbr2, the diode Dr1, and the switching element Tr1, and a path A24 including the capacitor Cbs1, the diode Dbr22, the capacitor Cbr2, the diode Dr1, and the switching element Tr1 according to the conduction of the switching element Tr1. Since the current of the path A24 is inhibited if the diode Ds1 is arranged between the switching element Ts1 and the DC power supply line LH, the diode Ds1 is arranged on the input end Ps side of the switching element Ts1.

Therefore, the capacitor Cbr2 is charged using the capacitors Cbr1, Cbs1 by conducting the switching element Tr1. Therefore, the amount of charges lost from the capacitor Cbr1 can be reduced compared to when charging the capacitor Cbr2 using one capacitor Cbr1. Furthermore, the voltages across both ends of the capacitors Cbr1, Cbs1 can be averaged.

In the illustration of FIG. 19, one end on the high potential side of the capacitor Cbr2 is connected to two capacitors Cbr1, Cbs1 through the diodes Dbr21, Dbr22, but is not limited thereto, and may be connected to three capacitors Cbr1, Cbs1, Cbt1 through the diodes, respectively.

The fifth embodiment may be applied to other power converters.

The capacitor described above all need to merely be able to accumulate the charges as the operation power supply of the switching element, and is not limited to the form of capacitor.

Any switching element does not need to be limited to the insulated gate bipolar transistor, and for example, may be an element having a different structure such as a bipolar transistor or a field effect transistor. For instance, in the case of the field effect transistor, the first electrode corresponds to the source electrode, and the second electrode corresponds to the drain electrode. The parallel circuit of the switching element and the diode may be configured with a MOSFET including a parasitic diode or a reverse conduction element such as a reverse conduction IGBT.

The fluctuation of the voltage across both ends of the capacitor dependent on the AC voltage does not necessarily require the current to flow through the path described above. The voltage across both ends of the capacitor may fluctuate by the fluctuation of the input end Px with respect to the potential of the DC power supply line LH.

A resistor, or the like may be inserted to the charging path of the capacitor to control the current during the charging.

The present invention has been described in detail above, but the description is merely illustrative in all aspects and should not be construed as limiting the present invention. It should be recognized that an infinite number of variants that are not described herein can be contrived without deviating from the scope of the invention.

DESCRIPTION OF SYMBOLS

Cbx1, Cbx2, Cby1 capacitor
Dbx1, Dbx2, Dby1, Dx1 diode
Ed DC power supply
LH, LL DC power supply line
Pr, Ps, Pt input end
Pu, Pv, Pw output end
VAx1, VAx2, VAy1 voltage adjustment unit

The invention claimed is:

1. A power converter comprising:
a first power supply line;
a second power supply line applied with a potential lower than that of said first power supply line;
a plurality of input ends connected with an AC power source;
a first switching element for connecting/disconnecting one of said plurality of input ends and at least one of either said first or second power supply line;
a second switching element arranged between said first and second power supply lines;
a power supply unit having two ends for supporting a DC voltage, being connected to said second switching element on said first or second power supply line side, said power supply unit serving as an operation power supply for outputting a switch signal to said second switching element;
a capacitor including one end connected to a point between said first switching element and said one of said plurality of input ends and the other end connected to one end on a high potential side of said power supply unit, said capacitor serving as an operation power supply for outputting a switch signal to said first switching element;

a voltage adjustment unit for adjusting a voltage across both ends of said capacitor.

2. The power converter according to claim 1, wherein said first switching element is connected between said one of said plurality of input ends and said second power supply line; and said second switching element is connected between said one of said plurality of input ends and said first power supply line, and connected to one end on a low potential side of said power supply unit on said first power supply line side.

3. The power converter according to claim 2, further comprising:
a third switching element connected in series with said first switching element on said one of said plurality of input ends side;
a first diode connected in parallel with said third switching element with an anode directed towards said second power supply line; and
a second diode connected in parallel with said first switching element with a cathode directed towards said second power supply line; wherein
said one end of said capacitor is connected between said first and third switching elements, and said capacitor serves as an operation power supply for outputting a switch signal to said first and third switching elements.

4. The power converter according to claim 3, further comprising a third diode arranged with a cathode directed towards said capacitor between one end on said high potential side of said power supply unit and said other end of said capacitor.

5. The power converter according to claim 3, further comprising:
third and fourth diodes; wherein
said power supply unit is one of a plurality of power supply units having two ends for supporting a DC voltage,
said second switching element is one of a plurality of switching elements arranged between said first and second power supply lines and for which said power supply units serve as respective operation power supplies for outputting respective switch signals thereto,
each of said plurality of second switching elements is arranged between each of said plurality of input ends and said first power supply line,
said third diode is arranged between an end of one of said plurality of power supply units and said other end of said capacitor, and
said fourth diode is arranged with a cathode directed towards said capacitor between an end of another one of said plurality of power supply units and said other end of said capacitor.

6. The power converter according to claim 2, further comprising a third diode arranged with a cathode directed towards said capacitor between one end on said high potential side of said power supply unit and said other end of said capacitor.

7. The power converter according to claim 2, further comprising:
second and third diodes, wherein
said power supply unit is one of a plurality of power supply units having two ends for supporting a DC voltage,
said second switching element is one of a plurality of switching elements arranged between said first and second power supply lines and for which said power supply units serve as respective operation power supplies for outputting respective switch signals thereto,
each of said plurality of switching elements is arranged between each of said plurality of input ends and said first power supply line,
said third diode is arranged between an end of one of said plurality of power supply units and said other end of said capacitor, and
said fourth diode is arranged with a cathode directed towards said capacitor between an end of another one of said plurality of power supply units and said other end of said capacitor.

8. The power converter according to claim 1, further comprising:
an output end, a third switching element; and
a diode; wherein
said first switching element is connected between said one of said plurality of input ends and said second power supply line, said third switching element is connected between said one of said plurality of input ends and said first power supply line,
said second switching element is connected between said first power supply line and said output end, and connected to one end on a low potential side of said power supply unit on said second power supply line, and
said diode is arranged with a cathode directed towards said capacitor between one end on said high potential side of said power supply unit and said other end of said capacitor.

9. The power converter according to claim 8, further comprising:
a plurality of output ends; and
second and third diodes; wherein
said power supply unit is one of a plurality of power supply units having two ends for supporting a DC voltage,
said second switching element is one of a plurality of switching elements arranged between said first and second power supply lines and for which said power supply units serve as respective operation power supplies for outputting respective switch signals thereto,
each of said plurality of switching elements is arranged between each of said plurality of output ends and said first power supply line,
said sixth diode is arranged between an end of one of said plurality of power supply units and said other end of said capacitor, and
said seventh diode is arranged with a cathode directed towards said capacitor between an end of another one of said plurality of power supply units and said other end of said capacitor.

10. The power converter according to claim 1, further comprising:
an output end;
a first diode arranged with a cathode directed towards said first power supply line between said first power supply line and said first switching element;
a second diode arranged with an anode directed towards said second power supply line between said second power supply line and said first switching element;
a third diode having a cathode connected to said one of said plurality of input ends and an anode connected to an anode of said first diode;
a fourth diode having an anode connected to said one of said plurality of input ends and a cathode connected to a cathode of said second diode; and
a fifth diode arranged with a cathode directed towards said capacitor between one end on said high potential side of said power supply unit and said other end of said capacitor; wherein said second switching element is connected between said first power supply line and said output end, and connected to one end on a low potential side of said power supply unit on said output end side.

11. The power converter according to claim 10, further comprising:
   a plurality of output ends; and
   sixth and seventh diodes; wherein
   said power supply unit is one of a plurality of power supply units having two ends for supporting a DC voltage,
   said second switching element is one of a plurality of switching elements arranged between said first and second power supply lines and for which said power supply units serve as respective operation power supplies for outputting respective switch signals thereto,
   each of said plurality of second switching elements is arranged between each of said plurality of output ends and said first power supply line,
   said sixth diode is arranged between an end of one of said plurality of power supply units and said other end of said capacitor, and
   said seventh diode is arranged with a cathode directed towards said capacitor between an end of another one of said plurality of power supply units and said other end of said capacitor.

12. The power converter according to claim 1, further comprising:
   first and second diodes, wherein
   said second switching element is connected in series with said first diode between said one of said plurality of input ends and said first power supply line, said first diode being arranged with a cathode directed towards said first power supply line side,
   said first switching element is connected in series with said second diode between said one of said plurality of input ends and said first power supply line, said second diode being arranged with a cathode directed towards said one of said plurality of input ends,
   a serial body of said second switching element and said first diode and a serial body of said first switching element and said second diode are connected in parallel to each other, and
   one end on said low potential side of said power supply unit is connected to said second switching element on said first power supply line side.

13. The power converter according to claim 7, further comprising a third diode arranged with a cathode directed towards said capacitor between one end on said high potential side of said power supply unit and the other end of said capacitor.

14. The power converter according to claim 1, further comprising:
   a plurality of output ends; and
   first and second diodes; wherein
   said power supply unit is one of a plurality of power supply units having two ends for supporting a DC voltage,
   said second switching element is one of a plurality of switching elements arranged between said first and second power supply lines and for which said power supply units serve as respective operation power supplies for outputting respective switch signals thereto,
   each of said plurality of switching elements is arranged between each of said plurality of output ends and said first power supply line,
   said first diode is arranged between an end of one of said plurality of power supply units and said other end of said capacitor, and
   said second diode is arranged with a cathode directed towards said capacitor between an end of another one of said plurality of power supply units and the other end of said capacitor.

15. The power converter according to claim 1, wherein said second switching element is connected between said one of said plurality of input ends and said first power supply line.

16. The power converter according to claim 1, further comprising an output end,
   wherein said second switching element is connected between said first power supply line and said output end.

17. The power converter according to claim 1, wherein said voltage adjustment unit adjusts a voltage fluctuation of said capacitor dependent on fluctuation of AC power applied to said plurality of input ends and to output an appropriate voltage as an operation voltage of said second switching element.

* * * * *